(12) United States Patent
Buskirk

(10) Patent No.: US 12,358,014 B2
(45) Date of Patent: Jul. 15, 2025

(54) NON-CONTACT DEPOSITION SYSTEMS INCLUDING JETTING ASSEMBLIES

(71) Applicant: Matthews International Corporation, Pittsburgh, PA (US)

(72) Inventor: William A. Buskirk, Albany, OR (US)

(73) Assignee: Matthews International Corporation, Pittsburgh, PA (US)

(*) Notice: Subject to any disclaimer, the term of this patent is extended or adjusted under 35 U.S.C. 154(b) by 1178 days.

(21) Appl. No.: 17/085,078

(22) Filed: Oct. 30, 2020

(65) Prior Publication Data

US 2021/0129173 A1 May 6, 2021

Related U.S. Application Data

(60) Provisional application No. 62/929,271, filed on Nov. 1, 2019.

(51) Int. Cl.
*B41J 2/14* (2006.01)
*B01L 3/00* (2006.01)
(Continued)

(52) U.S. Cl.
CPC ............. *B05C 5/0225* (2013.01); *B01L 3/00* (2013.01); *B01L 3/02* (2013.01); *B01L 3/0268* (2013.01);
(Continued)

(58) Field of Classification Search
CPC .... B41J 2002/14266; B41J 2002/14306; B41J 2/14274; B41J 2/14233; B41J 2002/14217;
(Continued)

(56) References Cited

U.S. PATENT DOCUMENTS 4,072,959 A 2/1978 Elmqvist
4,340,083 A 7/1982 Cummins
(Continued)

FOREIGN PATENT DOCUMENTS

CN 201022022 Y 2/2008
CN 101386236 A 3/2009
(Continued)

OTHER PUBLICATIONS

Inkjet Printing Definition, https://en.wikipedia.org/wiki/inkjet_printing.
(Continued)

*Primary Examiner* — Kristal Feggins
(74) *Attorney, Agent, or Firm* — DLA Piper LLP

(57) ABSTRACT

A non-contact deposition system comprises a jetting assembly including at least one micro-valve. The micro-valve includes an orifice plate defining an orifice therethrough. An actuating beam disposed in a spaced relationship to the orifice plate. The actuating beam including a base portion and a cantilevered portion extending from the base portion towards the orifice and is movable between a closed position and an open position. A sealing structure comprising a sealing member is disposed at the overlapping portion of the cantilevered portion. A fluid manifold is coupled to the micro-valve and defines a fluid reservoir containing a pressurized fluid. When the actuating beam is in the closed position, the cantilevered portion is positioned such that the sealing structure seals the orifice so as to close the micro-valve, and in the open position, the fluid is dispensed from the orifice towards a substrate and deposited thereon.

10 Claims, 14 Drawing Sheets

(51) Int. Cl.

| | | |
|---|---|---|
| B01L 3/02 | (2006.01) | |
| B05C 5/02 | (2006.01) | |
| B29C 64/209 | (2017.01) | |
| B33Y 30/00 | (2015.01) | |
| H02N 2/00 | (2006.01) | |
| G01N 35/10 | (2006.01) | |
| H05K 3/12 | (2006.01) | |

(52) U.S. Cl.
CPC ............ *B29C 64/209* (2017.08); *B33Y 30/00* (2014.12); *B41J 2/14282* (2013.01); *H02N 2/0005* (2013.01); *G01N 2035/1041* (2013.01); *H05K 3/125* (2013.01)

(58) Field of Classification Search
CPC .... B41J 2002/14225; B41J 2002/14241; B41J 2002/1425; B41J 2/14282; B41J 2/1429; B41J 2/14298; B41J 2/14201; B41J 2/14209; B41J 2202/05; B01L 2400/0439; B01L 2400/0633; B01L 3/502738; B01L 2300/0681; B01L 2300/044; B01L 3/00; B01L 3/02; B01L 3/0268; B29C 64/112; B22F 12/53; B05C 5/0225; H02N 2/0005; G01N 2035/1041; H05K 3/125
See application file for complete search history.

(56) References Cited

U.S. PATENT DOCUMENTS

| | | | |
|---|---|---|---|
| 4,409,601 | A | 10/1983 | Nilsson et al. |
| 4,450,375 | A | 5/1984 | Siegal |
| 4,564,846 | A | 1/1986 | Siegal |
| 4,629,926 | A | 12/1986 | Siegal |
| 4,758,226 | A | 7/1988 | Carre |
| 4,809,017 | A | 2/1989 | Fost |
| 4,962,391 | A | 10/1990 | Kitahara et al. |
| 5,072,959 | A | 12/1991 | Marullo |
| 5,079,472 | A | 1/1992 | Uhl et al. |
| 5,126,755 | A | 6/1992 | Sharpe et al. |
| 5,343,894 | A | 9/1994 | Frisch et al. |
| 5,441,579 | A | 8/1995 | Kaufman et al. |
| 5,441,597 | A | 8/1995 | Bonne et al. |
| 5,452,878 | A | 9/1995 | Gravesen et al. |
| 5,619,177 | A | 4/1997 | Johnson et al. |
| 5,784,083 | A | 7/1998 | Schumann et al. |
| 5,810,325 | A | 9/1998 | Carr |
| 5,857,491 | A | 1/1999 | Cooke |
| 5,901,939 | A | 5/1999 | Cabuz et al. |
| 6,024,340 | A | 2/2000 | Lazarus et al. |
| 6,116,517 | A | 9/2000 | Heinzl et al. |
| 6,142,444 | A | 11/2000 | Kluge |
| 6,164,621 | A | 12/2000 | Bouchard et al. |
| 6,352,337 | B1 | 3/2002 | Sharma |
| 6,367,767 | B2 | 4/2002 | Weinmann et al. |
| 6,412,913 | B1 | 7/2002 | Moon et al. |
| 6,450,204 | B2 | 9/2002 | Itzhaky |
| 6,460,979 | B1 | 10/2002 | Heinzl et al. |
| 6,464,341 | B1 | 10/2002 | Furlani et al. |
| 6,581,638 | B2 | 6/2003 | Frisch et al. |
| 6,590,267 | B1 | 7/2003 | Goodwin-Johanssen et al. |
| 6,676,249 | B2 | 1/2004 | Lebens |
| 6,811,136 | B2 | 11/2004 | Eberhardt et al. |
| 6,959,911 | B2 | 11/2005 | Strasser et al. |
| 6,988,706 | B2 | 1/2006 | Seeley et al. |
| 6,991,214 | B2 | 1/2006 | Richter |
| 7,159,841 | B2 | 1/2007 | Gemmen et al. |
| 7,299,818 | B2 | 11/2007 | Pinter et al. |
| 7,322,376 | B2 | 1/2008 | Frisch |
| 7,448,412 | B2 | 11/2008 | Teach et al. |
| 7,540,592 | B2 | 6/2009 | Silverbrook |
| 9,975,347 | B2 | 5/2018 | Tozuka et al. |
| 10,155,385 | B2 | 12/2018 | Hiramoto et al. |
| 2003/0030705 | A1 | 2/2003 | Koike et al. |
| 2003/0076649 | A1 | 4/2003 | Speakman |
| 2003/0222236 | A1 | 12/2003 | Eberhardt et al. |
| 2003/0234835 | A1 | 12/2003 | Torii et al. |
| 2004/0137300 | A1 | 7/2004 | Gemmen et al. |
| 2005/0133751 | A1 | 6/2005 | Seeley et al. |
| 2005/0259131 | A1 | 11/2005 | Wong et al. |
| 2006/0092237 | A1 | 5/2006 | Kwon et al. |
| 2006/0209137 | A1 | 9/2006 | Kojima et al. |
| 2006/0255064 | A1 | 11/2006 | Donaldson |
| 2010/0141709 | A1 | 6/2010 | DeBrabander et al. |
| 2010/0321448 | A1 | 12/2010 | Buestgens et al. |
| 2011/0073188 | A1 | 3/2011 | Marcus et al. |
| 2011/0073788 | A1 | 3/2011 | Marcus et al. |
| 2012/0268529 | A1 | 10/2012 | Baumer et al. |
| 2014/0333703 | A1 | 11/2014 | Buskirk et al. |
| 2016/0189494 | A1 | 6/2016 | Levesque et al. |
| 2017/0274658 | A1 | 9/2017 | Terasaki |
| 2018/0022105 | A1 | 1/2018 | Nakamura et al. |
| 2018/0056288 | A1 | 3/2018 | Abate et al. |
| 2018/0147848 | A1 | 5/2018 | Teranishi et al. |
| 2018/0162140 | A1 | 6/2018 | Buskirk et al. |
| 2018/0361747 | A1 | 12/2018 | Yaginuma et al. |
| 2018/0370230 | A1 | 12/2018 | Nakagawa et al. |
| 2019/0086793 | A1 | 3/2019 | Lyons et al. |
| 2019/0344564 | A1 | 11/2019 | Buskirk et al. |
| 2019/0344568 | A1 | 11/2019 | Buskirk et al. |
| 2019/0346051 | A1 | 11/2019 | Buskirk et al. |
| 2019/0346066 | A1 | 11/2019 | Buskirk et al. |
| 2019/0346067 | A1 | 11/2019 | Buskirk et al. |

FOREIGN PATENT DOCUMENTS

| | | |
|---|---|---|
| DE | 3608550 A1 | 9/1987 |
| DE | 10133939 A1 | 1/2003 |
| DE | 102004035844 B3 | 10/2005 |
| DE | 102007034049 B3 | 6/2008 |
| EP | 0170990 A1 | 2/1986 |
| EP | 0941434 A1 | 9/1999 |
| EP | 1104863 A2 | 6/2001 |
| EP | 2017511 A1 | 1/2009 |
| EP | 3187337 A1 | 7/2017 |
| JP | S57-178767 A | 11/1982 |
| JP | S57-197176 A | 12/1982 |
| JP | S63-185471 A | 8/1988 |
| JP | S64-18643 A | 1/1989 |
| JP | 02033979 A | 3/1990 |
| JP | 2273242 | 11/1990 |
| JP | 09-011471 A | 1/1997 |
| JP | 2819141 B2 | 10/1998 |
| JP | H11-105274 A | 4/1999 |
| JP | 2000-296619 A | 10/2000 |
| JP | 2002532658 A | 10/2002 |
| JP | 2004-308554 A | 11/2004 |
| JP | 2009243911 A | 10/2009 |
| JP | 2010208049 A | 9/2010 |
| JP | 2012507417 A | 3/2012 |
| JP | 2012241824 A | 12/2012 |
| JP | 05116284 B2 | 1/2013 |
| JP | 2013-533817 A | 8/2013 |
| JP | 2016132188 A | 7/2016 |
| JP | 2016132189 A | 7/2016 |
| JP | 2016525658 A | 8/2016 |
| WO | 1986005722 A1 | 10/1986 |
| WO | 2000038928 A1 | 7/2000 |
| WO | 2001074592 A1 | 10/2001 |
| WO | 2002037661 A1 | 5/2002 |
| WO | 2009010117 A1 | 1/2009 |
| WO | 2010144343 A3 | 3/2011 |
| WO | 2012002942 A1 | 1/2012 |
| WO | 2014182984 A1 | 11/2014 |
| WO | 2019215671 A1 | 11/2014 |
| WO | 2016030566 A1 | 3/2016 |
| WO | 2019215668 A1 | 11/2019 |
| WO | 2019215669 A1 | 11/2019 |
| WO | 2019215672 A1 | 11/2019 |

(56) References Cited

FOREIGN PATENT DOCUMENTS

WO          2019215674 A1    11/2019
WO          202108218 A1     5/2021

OTHER PUBLICATIONS

International Search Report and Written Opinion for PCT/IB2019/053837 dated Aug. 28, 2019.
International Search Report and Written Opinion for PCT/US2014/037422 dated Sep. 3, 2014.
Supplementary European Search Report and Written Opinion for EP 14795127 dated Jun. 8, 2018.
Xiaoting et al. "Vibration Energy Harvesting Using Piezoelectric Unimorph Cantilevers With Unequal Piezoelectric and Nonpiezoelectric Lengths" Dec. 2010, Applied Physics Letters 97:233503 (PubMed, DOI: 10.1063/1.3521389, retrieved from the internet Aug. 30, 2020).

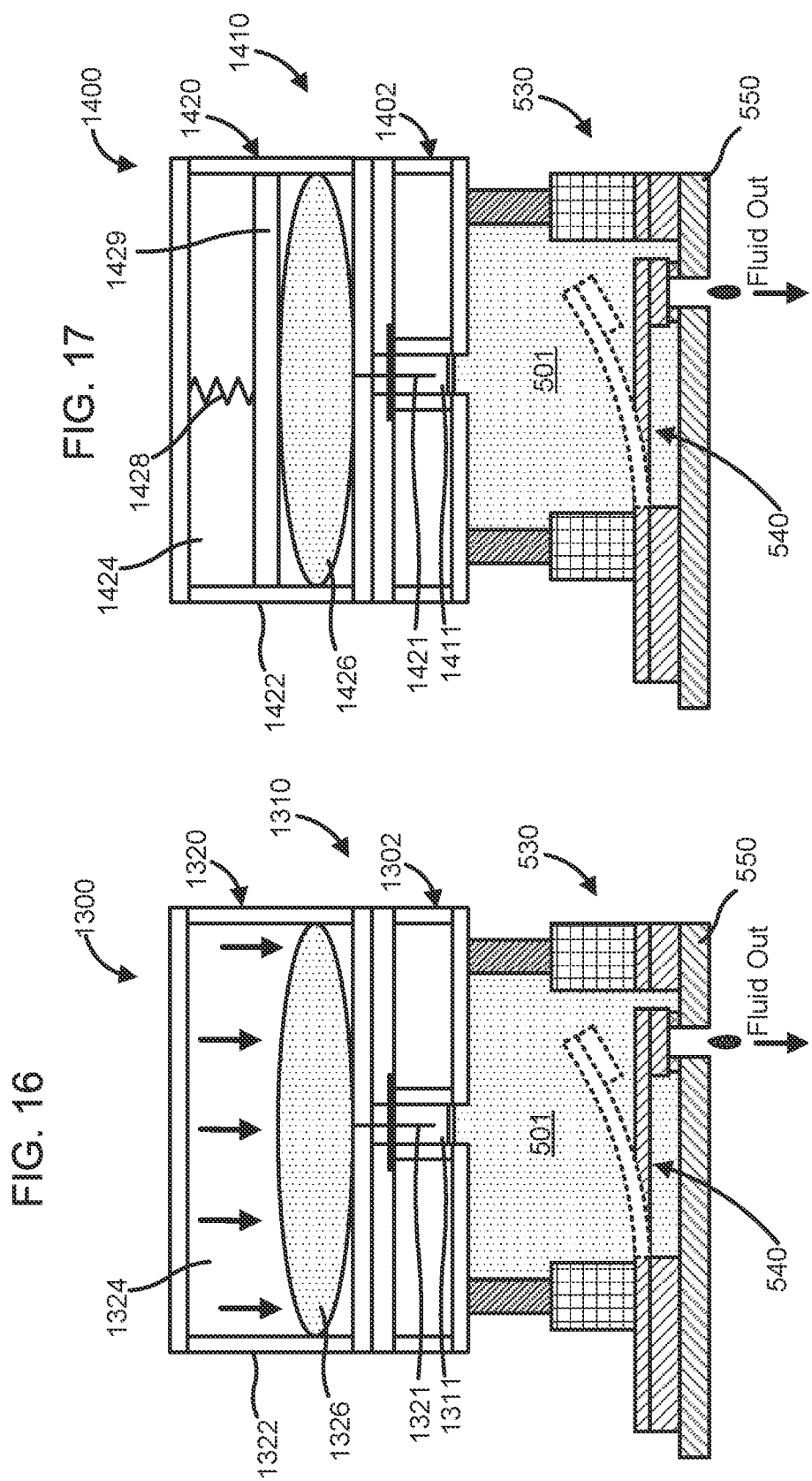

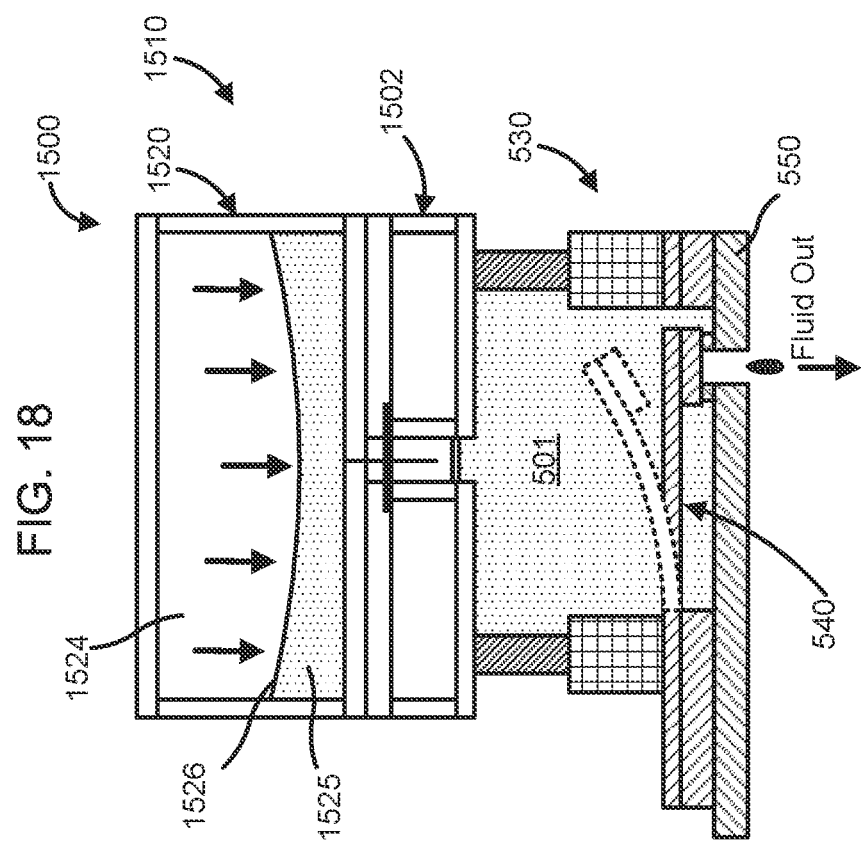

NON-CONTACT DEPOSITION SYSTEMS INCLUDING JETTING ASSEMBLIES

CROSS-REFERENCE TO RELATED APPLICATIONS

This application claims priority to U.S. Provisional Application Ser. No. 62/929,271 filed on Nov. 1, 2019, the content of which is hereby incorporated by reference in its entirety.

TECHNICAL FIELD

The present disclosure relates generally to the field of micro-valves fabricated using micro-electro-mechanical systems (MEMS) techniques. More specifically, the present disclosure relates to non-contact deposition systems that include a jetting assembly including MEMS micro-valves.

BACKGROUND

Conventional dispensing systems and deposition systems have several shortcomings. For example, in biological or biomedical applications, solutions including chemical, biochemical or biological molecules are generally manually deposited on a substrate using pipettes. Automated systems have been developed which are able to pipette multiple solutions simultaneously on a substrate. However, such systems generally still use pipette tips, the orifices of which remain exposed to air even when solutions are not being deposited through the pipette tips. Other deposition systems, such as micro-array printing assemblies, contact the substrate and deposit fluids using surface tension of the fluid. Such deposition assemblies suffer from inaccuracies in droplet size and volume and have to be evaporated in controlled environments to prevent evaporation of the solvents.

Similar shortcomings are also present in deposition systems used for printing or marking. For example, continuous inkjet printers have certain deficiencies that are difficult to eliminate. The process of generating droplets from an ink supply, for example, may lead to ink dripping in an undesired direction (e.g., away from a target), leading to maintenance requirements. Additionally, makeup fluid is lost over time as a result of evaporation, requiring continuous replenishment. Other maintenance costs, such as repairing orifice plates due to degradation, are also required. Furthermore, the orifice or opening from which the fluids are ejected generally remain open to air which can cause evaporation of solvents from the fluid, resulting in clogging and eventual failure of conventional deposition systems.

Finally, when the fluid to be dispensed is a gas such as air, conventional deposition systems or valves that are capable of controlling the dispensing of the gas are physically large and heavy, require excessive electrical energy, and sometimes fail due to mechanical problems with the various components that are contained therein. For these and other reasons, there is a need for improved dispensing devices and deposition devices.

SUMMARY

Embodiments described herein relate generally to non-contact deposition systems and in particular, to systems that include a jetting assembly including a micro-valve. The micro-valve comprises an orifice defined in an orifice plate and an actuating beam, which may remain in a closed position in its default position to seal the orifice, and is selectively opened to eject and deposit fluid onto a substrate.

In some embodiments, a non-contact deposition system comprises a jetting assembly comprising at least one micro-valve. Each micro-valve comprises an orifice plate including a first surface and a second surface. The orifice plate comprises an orifice extending from the first surface to the second surface. A spacing member is disposed on the first surface and is offset from the orifice. A valve seat surrounds the orifice and defines an opening in fluid communication with the orifice. An actuating beam is disposed on the spacing member and extends from the spacing member toward the orifice. The actuating beam comprises a layer of piezoelectric material and is movable between a closed position and an open position by applying an electrical signal to the layer of piezoelectric material. A sealing member is disposed on an end portion of the actuating beam. A fluid manifold is coupled to the micro-valve and defines a fluid reservoir containing a pressurized fluid around the actuating beam. When the layer of piezoelectric material does not have an electrical signal applied thereto, the actuating beam is in the closed position and a sealing member surface of the sealing member contacts the orifice plate to seal the orifice and close the micro-valve. Furthermore, in the open position fluid is ejected from the orifice towards a substrate and deposited thereon.

In another embodiment, the non-contact deposition system further comprises: a platform spaced apart from the jetting assembly and configured to receive a substrate on which the fluid is to be deposited; and a motion mechanism coupled to at least one of the jetting assembly or the platform and configured to provide three dimensional motion to the jetting assembly or the platform so as to deposit the fluid at a predetermined location on the substrate.

In another embodiment, the substrate comprises a histopathology cassette and wherein the fluid comprises a cell stain.

In another embodiment, the substrate comprises a circuit board, and wherein the fluid comprises a conductive fluid, a semi-conducting fluid or a piezoelectric fluid.

In another embodiment, the substrate comprises a fabric, a ceramic tile, engineered wood or laminate tile and wherein the fluid comprises at least one of conductive ink, paint, a nanocoating, or anti-microbial coating.

In another embodiment, the substrate comprises a slide and wherein the fluid comprises a solution of at least one of chemicals, biochemicals or biomolecules, and wherein the non-contact deposition system is configured to deposit an array of droplets of the solution on the slide.

In another embodiment, the substrate comprises a microwell plate defining a plurality of microwells, and wherein the fluid comprises a solution of at least one of chemical, biochemical or biological molecules, and wherein the non-contact deposition system is configured to deposit a volume of the solution in each of the plurality of microwells.

In another embodiment, the fluid comprises a polymer and wherein the non-contact deposition system is configured to deposit a plurality of layers of the polymer to form a 3-dimensional object having a predetermined shape.

In another embodiment, the non-contact deposition system further comprises: an interposer disposed on the fluid manifold and coupled thereto; and a carrier disposed on the interposer and coupled thereto such that orifice plate, the fluid manifold, the interposer and the carrier collectively define a boundary of the fluid reservoir, the carrier further defining a first fluid channel configured to deliver a first fluid to the fluid reservoir.

In another embodiment, the carrier further comprises a second fluid channel configured to deliver a second fluid different from the first fluid to the fluid reservoir.

In another embodiment, the jetting assembly is configured to selectively deliver the first fluid, the second fluid or a mixture comprising the first and second fluid through the orifice, the mixture forming within the fluid reservoir.

In another embodiment, the substrate comprises artificial fingernails or real fingernails, and wherein the first fluid comprises a first nail color and the second fluid comprises a second nail color.

In another embodiment, the substrate comprises a mixing palette, and the first fluid and the second fluid comprise at least one of a powder, a liquid or a gel.

In another embodiment, the carrier defines an internal volume, and a compressible fluid container containing the fluid is disposed within the internal volume.

In another embodiment, the internal volume of the carrier is filled with a compressed gas, the compressed gas configured to exert a pressure on the compressible fluid container, the pressure causing the fluid to be communicated through the fluid channel into the fluid reservoir.

In another embodiment, a biasing member is disposed within the internal volume, the biasing member configured to exert a pressure on the compressible fluid container, the pressure causing the fluid to be communicated through the fluid channel into the fluid reservoir.

In another embodiment, the fluid comprises one of an ink, a paint, a solvent, a biological solution, a biochemical solution, a chemical solution, a physiological fluid, an adhesive, a powder, a gel, a dye, a cell stain, a colloidal solution, an emulsion or a suspension.

In another embodiment, the fluid includes a volatile fluid or an air sensitive fluid, and wherein the jetting assembly is structured to limit exposure of the fluid to air present in an environment outside the jetting assembly.

In another embodiment, an array of orifices are defined in the orifice plate.

In another embodiment, the array comprises a rectangular array, a square array, a semi-circular array, an elliptical array, a polygonal array or an asymmetrical array.

In another embodiment, the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the valve seat so as to fluidly seal the orifice.

In another embodiment, the fluid is a gaseous fluid.

In another embodiment, there is a haptic interface device that comprises the non-contact deposition system of any of embodiments previously described herein.

In some embodiments, a non-contact deposition system, comprises a jetting assembly comprising at least one micro-valve. The at least one micro-valve comprises an orifice plate including a first surface and a second surface. The orifice plate comprises an orifice extending from the first surface to the second surface. An actuating beam is disposed in a spaced relationship to the orifice plate. The actuating beam includes a base portion and a cantilevered portion. The cantilevered portion extends from the base portion towards the orifice such that an overlapping portion thereof overlaps the orifice. The actuating beam is movable between a closed position and an open position. A sealing structure comprising a sealing member is disposed at the overlapping portion of the cantilevered portion. A fluid manifold is coupled to the micro-valve and defines a fluid reservoir containing a pressurized fluid around the actuating beam. When the actuating beam is in the closed position, the cantilevered portion is positioned such that the sealing structure seals the orifice so as to close the micro-valve. In the open position, the fluid is dispensed from the orifice towards a substrate and deposited thereon.

In another embodiment, the actuating beam comprises a layer of a piezoelectric material, the actuating beam moveable between the closed position and the open position in response to an electrical signal being applied to the piezoelectric material.

In another embodiment, when no electrical signal is applied to the piezoelectric material when the micro-valve is in the closed position.

In another embodiment, the non-contact deposition system further comprises: a platform spaced apart from the jetting assembly and configured to receive the substrate; and a motion mechanism coupled to at least one of the jetting assembly or the platform and configured to provide three dimensional motion to the jetting assembly or the platform so as to deposit the fluid at a predetermined location of on the substrate.

In another embodiment, the substrate comprises a histopathology cassette and wherein the fluid comprises a cell stain.

In another embodiment, the substrate comprises circuit board, and wherein the fluid comprises a conductive fluid, a semi-conducting fluid or a piezoelectric fluid.

In another embodiment, the substrate comprises a fabric, a ceramic tile, engineered wood or laminate tile and wherein the fluid comprises at least one of conductive ink, paint, a nanocoating, or anti-microbial coating.

In another embodiment, the substrate comprises a slide and wherein the fluid comprises a solution of at least one of chemicals or biomolecules, and wherein the non-contact deposition system is configured to deposit an array of droplets of the solution on the slide.

In another embodiment, the substrate comprises a microwell plate defining a plurality of microwells, and wherein the fluid comprises a solution of at least one of chemical, biochemical or biological molecules, and wherein the non-contact deposition system is configured to deposit a volume of the solution in each of the plurality of microwells.

In another embodiment, the fluid comprises a polymer and wherein the non-contact deposition system is configured to deposit a plurality of layers of the polymer to form a 3-dimensional object having a predetermined shape.

In another embodiment, the non-contact deposition system further comprises: an interposer disposed on the fluid manifold and coupled thereto; and a carrier disposed on the interposer and coupled thereto such that orifice plate, the fluid manifold, the interposer and the carrier collectively define a boundary of the fluid reservoir, the carrier further defining a first fluid channel configured to deliver a first fluid to the fluid reservoir.

In another embodiment, the carrier further comprises a second fluid channel configured to deliver a second fluid different from the first fluid to the fluid reservoir.

In another embodiment, the jetting assembly is configured to selectively deliver the first fluid, the second fluid or a mixture comprising the first and second fluid through the orifice, the mixture forming within the fluid reservoir.

In another embodiment, the substrate comprises artificial finger nails or real fingernails, and wherein the first fluid comprises a first nail color and the second fluid comprises a second nail color.

In another embodiment, the substrate comprises a mixing palette, and wherein the first fluid and the second fluid comprise at least one of a powder, a liquid or a gel.

In another embodiment, the carrier defines an internal volume, a compressible fluid container containing the fluid disposed within the internal volume.

In another embodiment, the internal volume of the carrier is filled with a compressed gas, the compressed gas configured to exert a pressure on the compressible fluid container, the pressure causing the fluid to be communicated through the fluid channel into the fluid reservoir.

In another embodiment, there is a biasing member is disposed within the internal volume, the biasing member configured to exert a pressure on the compressible fluid container, the pressure causing the fluid to be communicated through the fluid channel into the fluid reservoir.

In another embodiment, the fluid comprises one of an ink, a paint, a solvent, a biological solution, a biochemical solution, a chemical solution, a physiological fluid, an adhesive, a powder, a gel, a dye, a cell stain, a colloidal solution, an emulsion or a suspension.

In another embodiment, the fluid includes a volatile fluid or an air sensitive fluid, and wherein the jetting assembly is structured to limit exposure of the fluid to air present in an environment outside the jetting assembly.

In another embodiment, there is an array of orifices are defined in the orifice plate.

In another embodiment, the array comprises a rectangular array, a square array, a circular array, semi-circular array, an elliptical array, a polygonal array or an asymmetrical array.

In another embodiment, the actuating beam comprises a non-active portion, a tuning layer, and an actuation portion including the at least one layer of piezoelectric material, wherein the tuning layer has a predetermined tuning stress such that in the closed position, the sealing member contacts and exerts a force on the orifice so as to fluidly seal the orifice.

In another embodiment, the micro-valve further comprises a valve seat surrounding the orifice, the valve seat defining an opening in fluid communication with the orifice.

In another embodiment, the fluid is a gaseous fluid.

In another embodiment, a haptic interface device comprises the non-contact deposition system of any of the embodiments previously described herein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 16-18 are schematic illustrations of jetting assemblies that may be used in the non-contact deposition system of FIG. 8, according to various embodiments.

Figure 1:
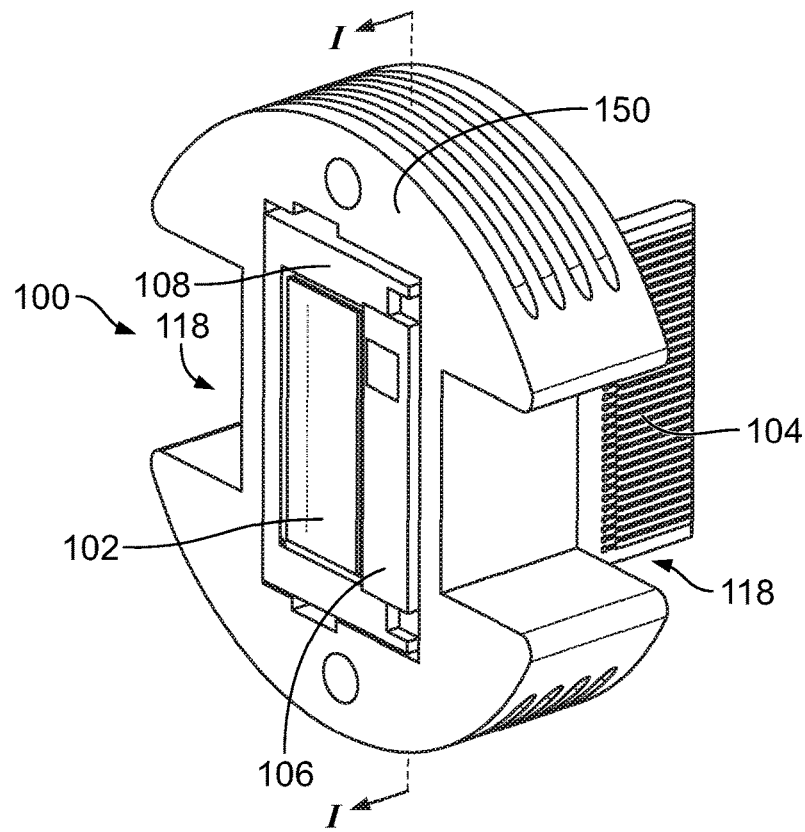
FIG. 1 is a perspective of a jetting assembly disposed in a holder, according to an example embodiment.

In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure described herein and illustrated in the figures can be arranged, substituted, combined, and designed in a variety of different configurations, all of which are contemplated and made part of this disclosure.

DETAILED DESCRIPTION

Embodiments described herein relate generally to non-contact deposition systems and in particular, to systems that include a jetting assembly including a micro-valve. The micro-valve comprises an orifice defined in an orifice plate and an actuating beam, which may remain in a closed position in its default position to seal the orifice, and is selectively opened to eject and deposit fluid onto a substrate.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Referring generally to the figures, described herein are jetting assemblies including multiple micro-valves, and non-contact deposition systems including such jetting assemblies. The micro-valves described herein employ an actuating beam having a sealing member disposed thereon. The utilization of such an actuating beam enables tailoring the micro-valve to eliminate or reduce various deficiencies associated with conventional technologies including continuous jetting assemblies. For example, in various embodiments, the micro-valve includes a spacing member disposed between the actuating beam and an orifice plate. The spacing member maintains a spacing of a first end of the actuating beam and an orifice within the orifice plate so as to prevent squeeze film damping of the actuating beam. The actuating beam extends over the orifice from the spacing member and a sealing member extends towards the orifice to contact the orifice directly, or otherwise contact a valve seat which may be disposed at the periphery of the orifice or a rim of the orifice. Thus, without application of any electrical energy to the actuating beam, the sealing member seals off the orifice. In other words, the default position of the actuating beam (e.g., configured by careful selection of the materials contained therein) is that the micro-valve is closed. As such, fluid {e.g., inks, paints, solvents, biological solutions, biochemical solutions, chemical solutions, physiological fluids (e.g., blood, urine, saliva, plasma, cerebrospinal fluid) adhesives, powders, gels, dyes, cell stains, a colloidal solution, a suspension, an emulsion, etc.} disposed in the micro-valve is sealed off from the external environment of the jetting assembly. This eliminates evaporation of the fluid, which reduces clogs. Additionally, the limited evaporation enables faster-drying fluid to be used, which allows for deposition at higher speeds than conventional systems.

To ensure proper sealing of the micro-valve described herein, a compatible relationship between the sealing member disposed on the actuating beam and the valve seat is maintained. The maintenance of such a relationship involves adjusting a number of factors pertaining to the jetting assembly's construction. In one aspect, steps are taken to ensure proper dimensioning of various components of the micro-valve. For example, in some embodiments, the spacing and sealing members described herein are formed in a single manufacturing step (e.g., through etching a portion of a wafer to form the spacing member and the sealing member in a single etching step) to ensure that they have the same thickness. Constructing these components in such a manner allows for precise control over the arrangement of components attached to the actuating beam, such as the dimensions of the sealing member and the length of the actuating beam. This allows the sealing member to be precisely aligned with the valve seat, which ensures that an adequate seal between the valve seat and sealing member, or the orifice plate and the sealing member is formed. Furthermore, manufacturing the sealing member and spacing member in such a manner enables these structures to share a common thickness, which facilitates a proper spacing between the actuating beam and the orifice plate. A fluid manifold is coupled to the micro-valve and defines a fluid reservoir around the micro-valve allowing deposition of the fluid onto a substrate when the actuating beam is in the open position.

Thus, a plurality of components of the jetting assembly described herein are constructed with the seal established at the interface between the sealing member and the orifice, and/or the valve seat in mind. The adequate seal beneficially prevents fluid from leaking at the orifice, which occurs in conventional continuous jetting assemblies. Beneficially, the micro-valves employed herein can be tailored to provide a desired droplet size. For example, in one embodiment, the orifice in the orifice plate is approximately 60 microns in diameter. In particular embodiments, the orifice plate may have a thickness in a range of 60-900 microns (e.g., 350 microns). In some embodiments, a ratio of a length of the diameter of the orifice may be in range of 1:1 to 15:1. An electrical signal may be applied to the actuating beam, which, via at least one layer of piezoelectric material contained therein, causing the actuating beam to temporarily depart from the valve seat to create a fluid outlet at the valve seat and orifice for a predetermined period (e.g., based on a desired droplet frequency). As such, based on the volume of the orifice and the droplet frequency, a volume of fluid is ejected from the orifice to formulate a droplet disposed on a substrate to create a desired marking, pattern, solution or object. In various embodiments, with the droplet frequency configured at approximately 10 kHz, the micro-valve employed herein may produce droplets having a volume of approximately 600 pL. This is larger than those produced with conventional deposition systems, which typically only generate droplets having a volume of approximately 30 pL. As a result of this larger drop size, the jetting assembly described herein may utilize a larger throw distance, thereby enabling images to be formed on a desired object at greater distances than conventional systems.

Various embodiments of the non-contact deposition system including jetting assemblies described herein provide benefits including, for example: (1) preventing evaporation of fluids by keeping the micro-valve closed in a default position thereof, when fluid deposition is not being performed; (2) using electric power only for opening the micro-valve, thereby reducing power consumption; (3) allowing accurate deposition of fluid volumes in a range from 500 picoliters (pL) to 5 milliliters (mL), or even larger volumes; (4) allowing deposition of a variety of fluids including, but not limited to inks, conductive inks, paints, dyes, cell stains, polymers, adhesives, suspensions, emulsions, nanocoating, anti-microbial coatings, powders, biological solutions, biochemical solutions, chemical solutions, etc.; (5) allowing deposition of a plurality of fluids from a single micro-valve; (6) integrating pumping capabilities such that an external pumping or compression system for providing pressurized fluid to the jetting assembly may be excluded; and (7) allowing deposition of fluids in various patterns by allowing motion capabilities and/or providing orifices defined in an orifice plate in a predetermined pattern.

As described herein, the term "default position," when used in describing an actuating beam of a micro-valve, describes the position of the actuating beam with respect to various other components of the micro-valve without application of any control signals (e.g., an electrical charge, current or voltage) to the actuating beam. In other words, the default position is the position of the actuating beam (and any components attached thereto) when the actuating beam is in a passive state.

Referring now to FIG. 1, a perspective view of a jetting assembly 100 disposed in a holder 150 is shown, according to an example embodiment. Jetting assembly 100 includes a valve body 102 attached to a carrier 108. The holder 150 includes a substantially circular-shaped body having an opening contained therein adapted to receive the jetting assembly 100. Holder 150's body may include notches 118 extending from a peripheral edge thereof to facilitate attachment of the holder 150 to a marking device. The valve body 102 may be a component of a marking device. In an exemplary embodiment, the valve body 102 is used in a non-contact deposition system including a pressurized fluid supply.

As described herein, the valve body 102 includes an input fluid manifold attached to a plurality of micro-valves. The micro-valves and the input fluid manifold form a fluid plenum or reservoir configured to hold fluid received from an external fluid supply. In other embodiments, the valve body 102 may define a plurality of fluid plenums, each fluid plenum corresponding to at least a portion of the plurality of micro-valves. In such embodiments, each fluid plenum may be filled with a different colored fluid (e.g., a different colored ink such black, green, yellow, cyan, etc. or different fluids) so as to provide capability of depositing multiple fluids. In various embodiments, the micro-valves include an actuating beam configured to move (e.g., bend, curve, twist, etc.) in response to voltages being applied thereto to temporarily open fluid outlets at orifices in an orifice plate. As a result, droplets are emitted from the fluid outlets onto a target to produce a desired marking pattern on the target.

As shown, a circuit board 104 is attached to a side surface of the carrier 108. Circuit board 104 may include a plurality of electrical pathways and provide a point of connection between valve body 102 and an electrical controller (e.g., via a wiring harness). The electrical controller may supply control signals via the electrical pathways to control actuation of the actuating beams of multiple micro-valves included in the valve body 102. The structure and function of such micro-valves are described in greater detail herein. In some embodiments, circuit board 104 itself includes a micro-controller that generates and provides control signals to actuate the micro-valves.

An identification tag 106 is attached to jetting assembly 100. In some embodiments, the identification tag 106 includes an internal memory configured to store various forms of information (e.g., manufacturing information, serial number, valve calibration information, settings, etc.) regarding jetting assembly 100. For example, in one embodiment, identification tag 106 is a radio frequency identification (RFID) tag configured to transmit the stored information to a in a receivable manner in response to receiving a predetermined identifier from an external device. This way, information regarding jetting assembly 100 may be quickly and efficiently retrieved.

Figure 2:
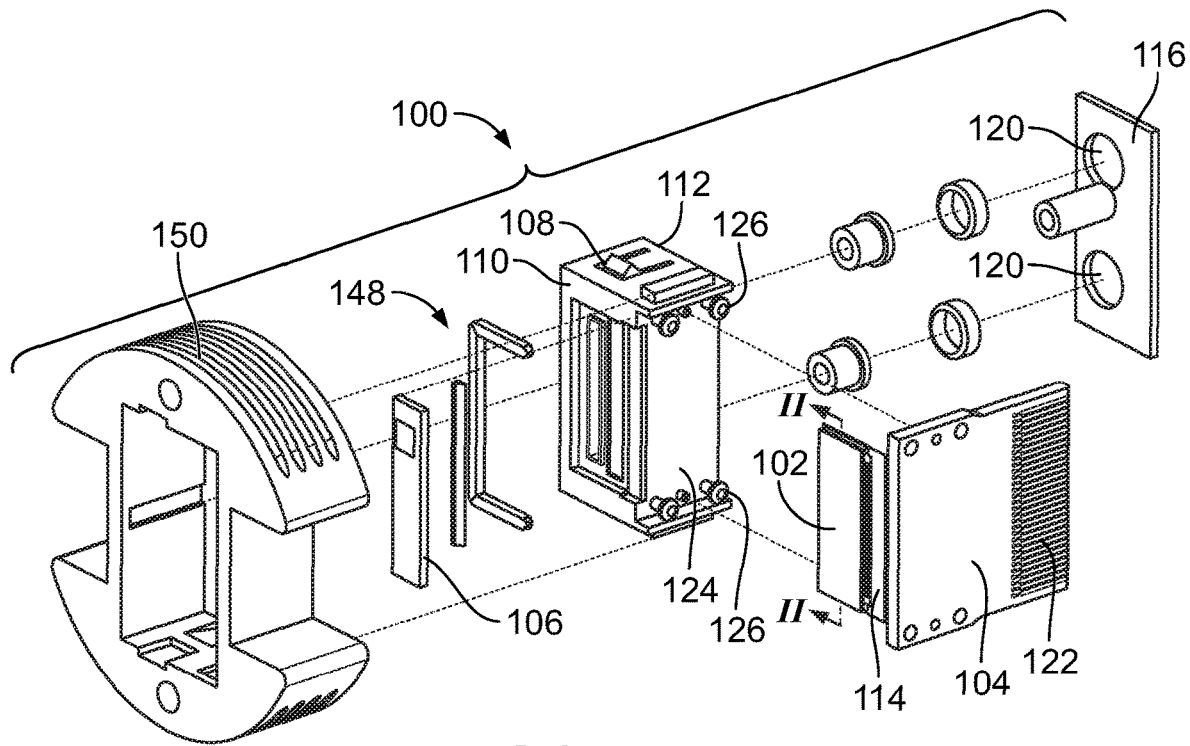
FIG. 2 is an exploded view of the jetting assembly shown in FIG. 1

Referring now to FIG. 2, an exploded view of jetting assembly 100 is shown, according to an example embodiment. Carrier 108 includes a front-side surface 110, a rear-side surface 112, and a side surface 124. In various embodiments, valve body 102 is attached to front-side surface 110 via an adhesive. The rear-side surface 112 has a cover 116 disposed thereon. Cover 116 includes apertures 120 providing supply ports for fluid (e.g., ink) for deposition onto a target via the valve body 102. For example, in some embodiments, fluid (e.g., ink) is supplied to the valve body 102 via a first one of the apertures 120 (e.g., via an input supply line or hose), circulated through valve body 102, and output from the valve body 102 via a second one of the apertures 120. In other words, the fluid is recirculated through the fluid plenum. A septum may be positioned in each of the apertures 120 and configured to allow insertion of a fluid delivery or fluid return pin therethrough so as to allow communication of the fluid into the fluid plenum while maintaining fluidic sealing of the jetting assembly 100. While not shown, in some embodiments, a heating element (e.g., a resistive wire) may be positioned proximate to the valve body 102 or the carrier 108 (e.g., around or coupled to side wall thereof). The heating element may be used to selectively heat the fluid (e.g., ink) contained within the fluid plenum so as to maintain the fluid at a desired temperature.

The front-side surface 110 includes a cavity adapted to receive valve body 102 such that valve body 102 is mounted securely to the front-side surface 110 (e.g., via an adhesive). Circuit board 104 is attached to carrier 108 via the side surface 124. As shown, the side surface 124 includes mounting pegs 126. In various embodiments, circuit board 104 includes apertures arranged in a manner corresponding to the arrangement of the mounting pegs 126 and are adapted to receive the mounting pegs 126 to align the circuit board 104 to the carrier 108.

As shown, circuit board 104 has a flex circuit 114 attached thereto. Flex circuit 114 extends at an angle from circuit board 104 and is attached to the carrier 108 proximate to the front-side surface 110. The valve body 102 and circuit board 104 are arranged perpendicularly to one another, as the flex circuit 114 extends around a corner boundary of front-side surface 110. Circuit board 104 also includes a controller interface 122 including electrical connection members (e.g., pins) configured to receive control signals, for example, from a deposition system controller.

As described herein, in various embodiments, flex circuit 114 may be disposed between a fluid manifold and the carrier 108, or an interposer disposed between the carrier 108 and the valve body 102 to facilitate formation of electrical connections between flex circuit 114 and electrodes of the plurality of micro-valves included in valve body 102. In some embodiments, flex circuit 114 is attached to front-side surface 110 via a mounting member 148. An opening in flex circuit 114 is aligned with the septum in carrier 108 to provide a fluid inlet to a fluid plenum formed via the valve body 102.

Figure 3:
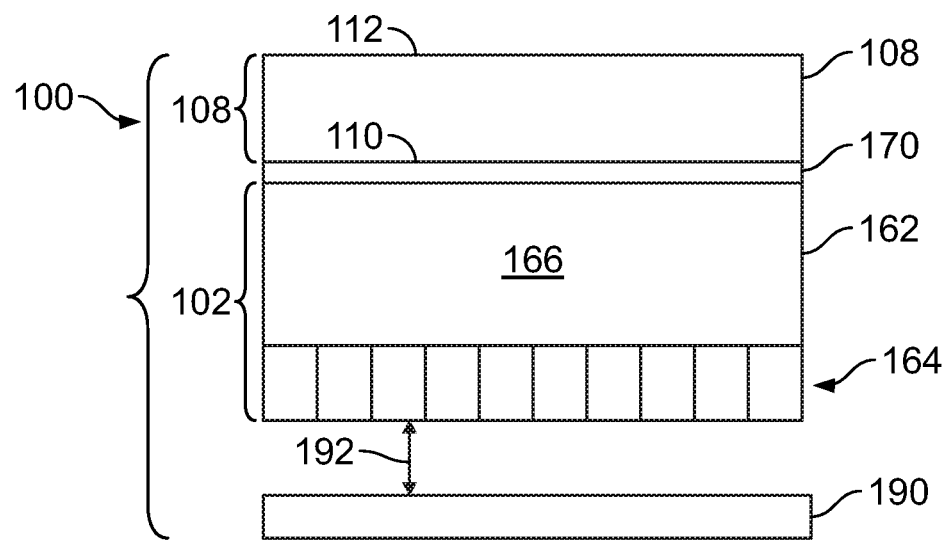
FIG. 3 is a schematic cross-sectional view of the jetting assembly shown in FIG. 1.

Referring now to FIG. 3, a schematic depiction of various components of jetting assembly 100 is shown, according to an example embodiment. For example, FIG. 3 may depict a cross sectional view of jetting assembly 100 at the line I-I shown in FIG. 1. As shown, the valve body 102 extends from front-side surface 110 of the carrier 108 via an interposer 170. The interposer 170 provides structure support to ensure maximal performance of various components in valve body 102.

The valve body 102 includes an input fluid manifold 162 and a plurality of micro-valves 164 attached to the input fluid manifold 162. The micro-valves 164 and input fluid manifold 162 form a fluid plenum 166 for fluid (e.g., a combination of ink and makeup fluid) received from a pressurized fluid supply (e.g., via apertures 120 in a cover 116 attached to the rear-side surface 112). In various embodiments, the fluid supply includes a fluid reservoir and a pump configured to provide pressurized fluid to jetting assembly 100 via a supply line coupled to carrier 108. In various embodiments, the fluid supply supplies fluid pressurized between 7 and 15 PSI when one or more of the micro-valves 164 are open. For example, in one embodiment, the fluid has a pressure of approximately 10 PSI when one or more micro-valves are open. Carrier 108 may include an internal cavity configured to receive the pressurized fluid and deliver the fluid to the fluid plenum 166. In various embodiments, a pressure differential may be maintained between the fluid plenum and the fluid supply so as to drive the fluid out of the valve body 102. A pressure sensor may be provided in the valve body 102 and/or the carrier 108 to determine the pressure differential and/or pumping pressure of fluid pumped through the valve body 102.

Input fluid manifold 162 may include a glass structure including a channel forming the fluid plenum. Generally, the micro-valves 164 include actuating beams held in spaced relation to orifices on an orifice plate at the front-side surface 110 where the fluid is emitted from. The actuating beams may include at least one layer of piezoelectric material configured to deflect in response to receiving control signals (e.g., electrical voltage waveforms provided via controller interface 122 on the circuit board 104). As described herein, application of such electrical signals causes the micro-valves 164 to open, which causes droplets to be released at the orifice plate. The droplets advance a throw distance 192 onto a substrate 190 to produce a desired pattern on the substrate 190. The structure and function of various components of micro-valves 164 is described in greater detail herein. In other embodiments, the actuating beam may include a stainless steel actuating beam (e.g., having a length of approximately 1 mm). In still other embodiments, the actuating beam may include a bi-morph beam having a two layers of piezoelectric material disposed on either side of a base layer (e.g., a base silicon layer or stainless steel layer). An electrical signal (e.g., an electrical voltage) may be applied to either one of the piezoelectric layers so as to urge the actuating beam to bend towards the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance towards the orifice.

While embodiments described herein generally describe the actuating beam as including a piezoelectric material, in other embodiments, any other actuation mechanism may be used. For example, in some embodiments, the actuating beams may include a capacitive coupling for moving the actuating beams. In other embodiments, the actuating beams may include an electrostatic coupling. In still other embodiments, the actuating beams may include a magnetic coupling (e.g., an electromagnetic structure activated by an electromagnet) for moving the beam. In yet other embodiments, the actuating beams may comprise a temperature sensitive bimetallic strip configured to move in response to temperature change.

Interposer 170 generally adds rigidity to various portions of the valve body 102. For example, the interposer 170 may be constructed to be more rigid than components (e.g., the orifice plate, the actuating beam, etc.) of valve body 102 to counteract stressed induced by attaching such components to one another. For example, the interposer 170 may be attached to valve body 102 to counteract stresses induced by an adhesive used to attach the carrier 108 to the valve body 102. Additionally, the interposer 170 may counteract stresses at interfaces between the input fluid manifold 162 and micro-valves 164.

Figure 4:
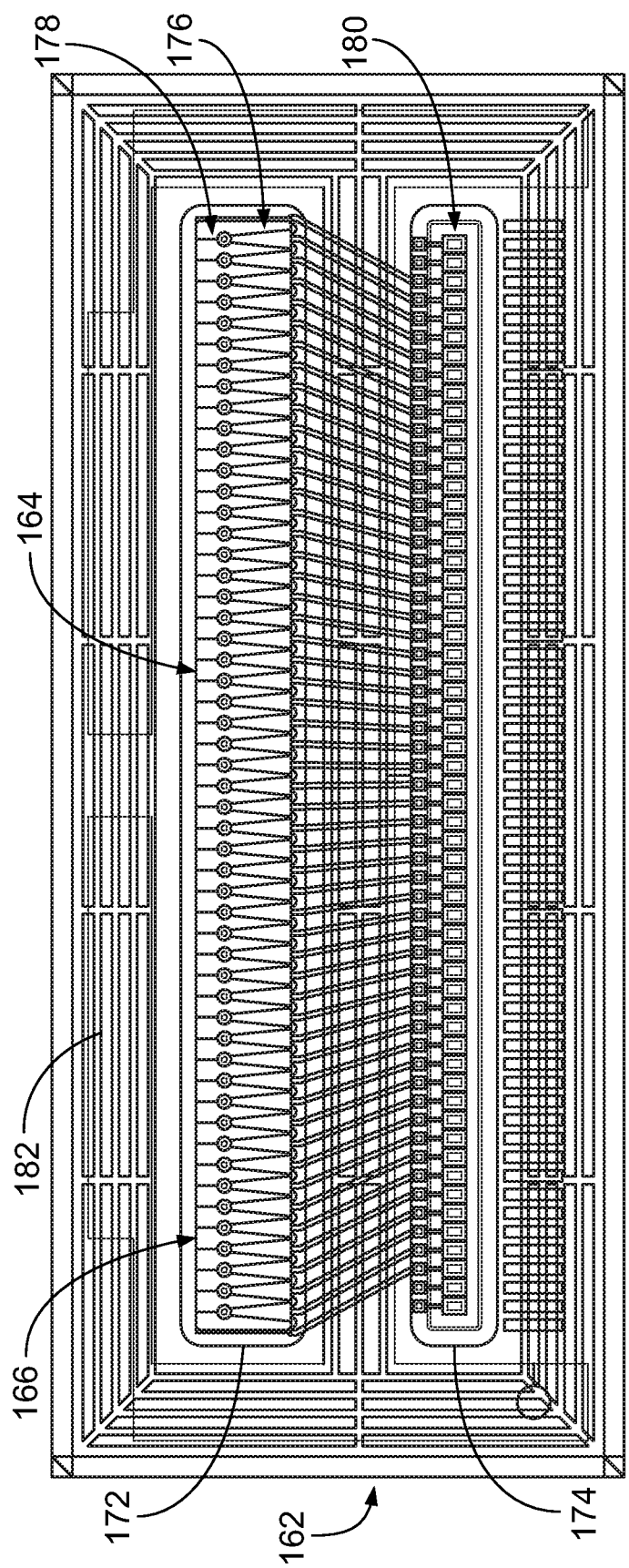
FIG. 4 is a plan view of the jetting assembly shown in FIG. 1.

Referring now to FIG. 4, a plan view of the jetting assembly 100 is shown, according to an example embodiment. FIG. 4 shows a plan view of valve body 102 at the line II-II shown in FIG. 2. As such, FIG. 4 shows a plan view at an interface between input fluid manifold 162 and orifice plate. Input fluid manifold 162 includes a first opening 172 and a second opening 174. The first opening 172 exposes the plurality of micro-valves 164 to form the fluid plenum 166 configured to hold fluid received from a fluid supply.

In the example shown, the plurality of micro-valves 164 include a plurality of actuating beams 176 aligned in a single row. Each of the plurality of actuating beams 176 has a sealing member 178 disposed at an end thereof. In some embodiments, the sealing members 178 are aligned with and contact valve seats disposed at orifices in the orifice plate to prevent fluid contained in the fluid plenum 166 from escaping the fluid plenum 166 in the absence of any electrical signals. The jetting assembly 100 is shown to include 52 actuating beams 176 forming 52 micro-valves 164. In other embodiments, the jetting assembly 100 may include any number of actuating beams.

In various embodiments, each of the plurality of actuating beams 176 extends from a member disposed underneath a boundary between the first and second openings 172 and 174. Each of said members may include an electrical connection portion exposed via the second opening 174. Electrical contact pads 180 are disposed at each of the electrical connection portions. Wire bonds electrically connect each of the electrical connection portions to the controller interface 122 via electrical contact pads 180. As such, electrical signals may be received by each of the actuating beams 176 via the electrical contact pads 180. In some embodiments, tape-automated bonding (TAB) may be used to electrically connect each of the electrical connection portions to the controller interface.

The boundary between the first and second openings 172 and 174 isolates the electrical contact pads 180 from the fluid contained in a reservoir formed by the fluid opening 172. Also beneficially, the electrical contact pads 180 are disposed beneath input fluid manifold 162. This means that electrical connections between actuating beams 176 are disposed on the interior of carrier 108 and are protected from deterioration and external contamination.

To isolate electrical contact pads 180 from the fluid contained in the fluid plenum 166, an adhesive structure 182 is disposed on input fluid manifold 162. Adhesive structure 182 couples the input fluid manifold 162 to the orifice plate. As shown in FIG. 4, adhesive structure 182 forms "racetracks" around each of the first and second openings 172 and 174. The racetracks provide barriers for fluid that seeps between the input fluid manifold 162 and the orifice plate. For example, the racetracks may be constructed of several concentric rectangular loops of an adhesive material (e.g., a photo resist such as a bisphenol-A novalac glycidyl ether based photoresist sold under the tradename SU-8 or polymethylmethacrylate, polydimethylsiloxane, silicone rubber, etc.) around each of the first and second openings 172 and 174. Segments of adhesive material may cut across multiple ones of the rectangular loops to form compartments for receiving seeping fluid. Such an adhesive structure 182 facilitates fluidic isolation between micro-valves 164 and electrical contact pads 180.

Figure 5A:
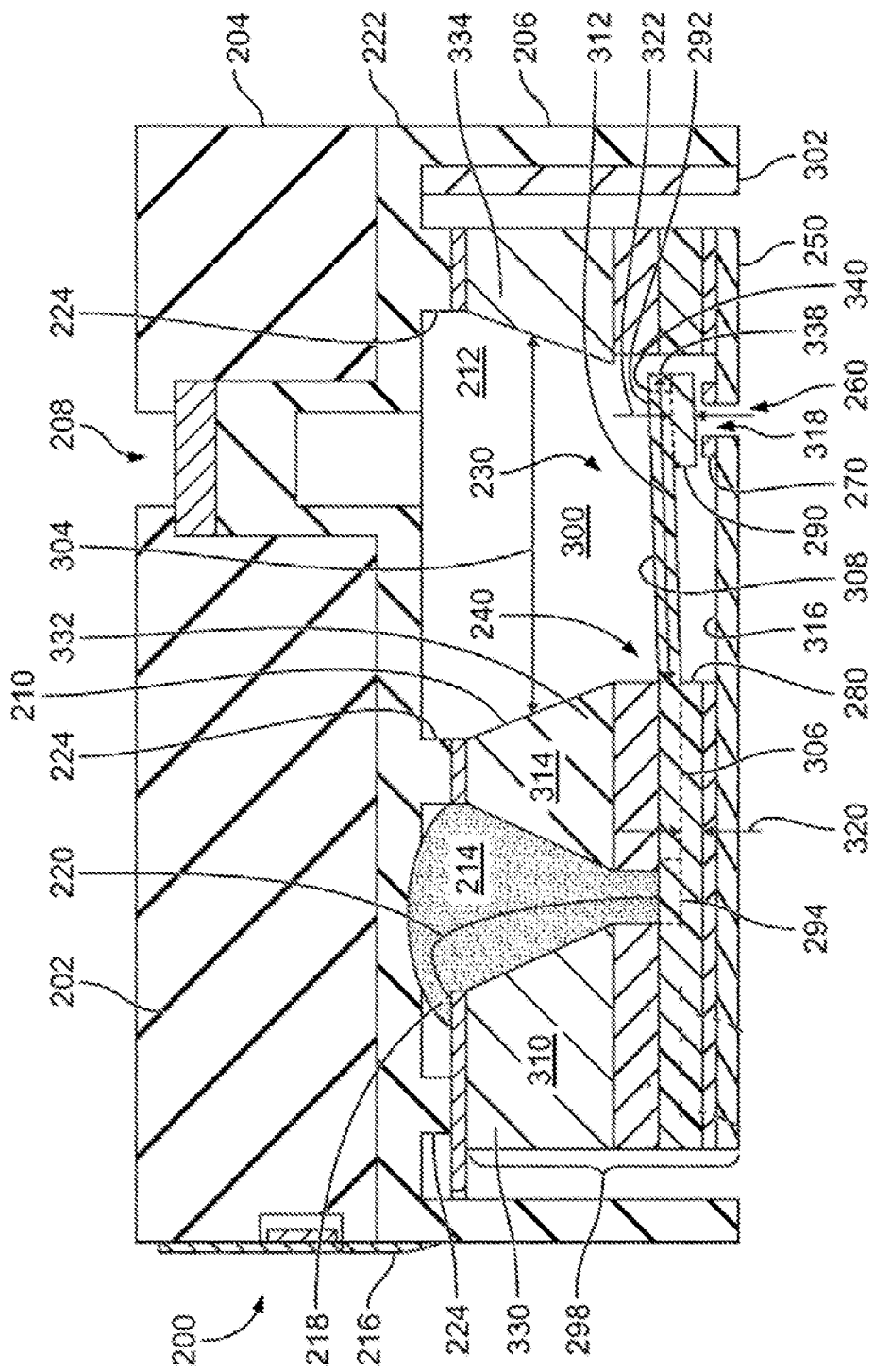
FIG. 5A is a-cross sectional view of a jetting assembly including a micro-valve, according to an example embodiment.

Referring now to FIG. 5A, a cross sectional view of a jetting assembly 200 including a micro-valve 230 is shown, according to an example embodiment. In some embodiments, jetting assembly 200 is an example embodiment of the jetting assembly 100 described with respect to FIGS. 1, 2, 3, and 4. As shown, jetting assembly 200 includes a carrier 202 attached to a valve body 298 via a structural layer 222. In some embodiments, the structural layer 222 may be part of the carrier 202.

Carrier 202 includes an upper portion 204 and a housing portion 206 extending from an edge of upper portion 204. Upper portion 204 includes a septum 208 by which pressurized ink is provided. Housing portion 206 defines a cavity into which the valve body 298 is disposed. Valve body 298 includes an input fluid manifold 210 and the micro-valve 230. As shown, input fluid manifold 210 and micro-valve 230 define a reservoir 300 configured to hold a volume of pressured fluid received from an external fluid supply via septum 208. In various embodiments, the pressurized fluid held within the reservoir 300 may include but is not limited to inks, paints, solvents, biological solutions, biochemical solutions, chemical solutions, physiological fluids (e.g., blood, urine, saliva, plasma, cerebrospinal fluid) adhesives, powders, gels, dyes, cell stains, a colloidal solution, a suspension, an emulsion, or any other suitable fluid.

Carrier 202 may be formed of plastic, ceramic, or any other suitable material. Carrier 202 facilitates operation of the jetting assembly 200 by providing structural support to valve body 298. For example, in some embodiments, peripheral edges of valve body 298 are attached to housing portion 206 via layers of adhesive 302 disposed at the inner surface of housing portion 206. Such adhesive facilitates maintenance of a desired relative positioning between micro-valve 230 and input fluid manifold 210.

In various embodiments, input fluid manifold 210 is pre-formed prior to its attachment to the additional components of the jetting assembly 200. Fluid manifold 210 is formed by a body 310 (e.g., formed from glass, silicon, silica, etc.) having any suitable thickness (e.g., 500 microns). As shown, input fluid manifold 210 is pre-formed to include a first channel 212 and a second channel 214. The first and second channels 214 are substantially linear and parallel to one another in the shown embodiment, but input fluid manifold 210 may be arranged as needed for the arrangement of micro-valves to be disposed thereon. First channel 212 is formed to have a width 304 bearing a predetermined relationship to a length 312 of a cantilevered portion 308 of an actuating beam 240 of the micro-valve 230. For example, first channel 212 may be formed to have a width 304 greater than a desired length 312 of cantilevered portion 308 by a threshold amount. Second channel 214 provides an avenue for an electrical connection to be formed between the actuating beam 240 and a flex circuit 216 via wire bonds 220 extending in between. Beneficially, using such an arrangement internalizes electrical connections between actuating beam 240 and flex circuit 216. In other words, electrical connections between such components are not external to carrier 202, and are thus less vulnerable to degradation. In various embodiments, the first channel 212 and/or the second channel 214 may have inclined sidewalls.

As shown, second channel 214 is substantially filled with an encapsulant 218. Encapsulant 218 may include an epoxy-type or any other suitable material. Encapsulant 218 envelopes electrical connections formed between wire bonds 220, the flex circuit 216, and actuating beam 240 and is configured to protect the wire bonds 220 from physical damage, moisture and corrosion. Thus, encapsulant 218 ensures the maintenance of an adequate electrical connection between flex circuit 216 and actuating beams 240 to facilitate providing electrical control signals to actuating beams 240 to cause movement thereof to open and close micro-valve 230.

The portion 314 of input fluid manifold 210 separating the first and second channels 212 and 214 serves as a barrier preventing fluid contained in the reservoir 300 from reaching the electrical connections. As such, input fluid manifold 210 serves as both part of the reservoir 300 for pressured fluid received from an external fluid supply and an insulating barrier between the pressured fluids and any electrical connections contained within jetting assembly 200. First and second channels 212 and 214 may be formed using any suitable process (e.g., via sandblasting, physical or chemical etching, drilling, etc.). In some embodiments, rather than being constructed of glass, input fluid manifold 210 is constructed of silicon, silica, ceramics or any other suitable material.

With continued reference to FIG. 5A, micro-valve 230 includes an orifice plate 250 attached to actuating beam 240. The orifice plate 250 may be formed from any suitable material, for example, glass, stainless steel, nickel, nickel with another layer of electroplated metal (e.g., stainless steel), polyimide (e.g., kapton) or a photoresist (e.g., SU-8, polymethylmethacrylate, etc.). Orifice plate 250 is substantially planar and includes an orifice 260 extending between a first surface and a second surface opposite the first surface thereof. In various embodiments, the orifice 260 is substantially cylindrical-shaped and has a central axis that is perpendicular or substantially perpendicular to surfaces of orifice plate 250. A valve seat 270 is disposed on an internal surface 316 of orifice plate 250 proximate to orifice 260. In various embodiments, valve seat 270 comprises a compliant material that surrounds or substantially surrounds orifice 260. In some embodiments, valve seat 270 is constructed from an epoxy-based adhesive such as an SU-8 photoresist. In other embodiments, the valve seat 270 may be formed from a moldable polymer, for example, polydimethylsiloxane or silicone rubber. Valve seat 270 defies an interior opening 318 substantially aligned with orifice 260 to create an outlet for pressurized fluid contained in the reservoir 300. In particular embodiments, the valve seat 270 might be excluded such that a sealing member surface of the actuating beam 240 contacts the orifice plate 250 around the orifice 260 to seal the orifice 260 and close the micro-valve 230.

The actuating beam 240 includes a base portion 306 and a cantilevered portion 308. Base portion 306 extends underneath the portion 314 of input fluid manifold 210 separating the first and second channels 212 and 214. As shown, the base portion 306 includes an electrical connection portion 294 in a region that overlaps with the second channel 214. Electrical connection portion 294 includes an electrode through which an electrical connection is formed with flex circuit 216 via wire bonds 220. The cantilevered portion 308 extends into the reservoir 300 from the portion 314 of input fluid manifold 210. As shown, cantilevered portion 308 is disposed on a spacing member 280 and, as a result, is spatially separated from orifice plate 250. Thus, there is space on either side of cantilevered portion 308 such that the actuating beam 240 may bend towards and/or away from the orifice plate 250 as a result of application of electrical signals thereto via electrical connection portion 294. The spacing member 280 is configured to prevent squeeze film damping of the actuating beam.

Cantilevered portion 308 has a length 312 such that the cantilevered portion extends from a boundary of the reservoir 300 by a predetermined distance. In various embodiments, the predetermined distance is specifically selected such that a portion 292 of cantilevered portion 308 overlaps the valve seat 270 and orifice 260. A sealing member 290 extends from the portion 292 of the actuating beam 240 overlapping orifice 260. In some embodiments, sealing member 290 is constructed to have a shape that substantially corresponds to a shape of orifice 260. For example, in one embodiment, both orifice 260 and sealing member 290 are substantially cylindrical-shaped, with sealing member 290 having a larger outer diameter. Such a configuration facilitates sealing member 290 covering orifice 260 in its entirety to enable a seal to be formed between sealing member 290 and valve seat 270. In other embodiments, the orifice 260 may have any other shape, e.g., star shape, square, rectangular, polygonal, elliptical or an asymmetric shape. In particular embodiments, the valve seat 270 may define a recess size and shaped to receive the sealing member 290. In various embodiments, the orifice plate 250 and therefore, the orifice 260 may be formed from a non-wetting (e.g., hydrophobic) material such as silicon or Teflon. In other embodiments, a non-wetting (e.g., hydrophobic) coating may be disposed on an inner wall of the orifice 260. Such coatings may include, for example, Teflon, nanoparticles, an oleophilic coating or any other suitable coating.

In various embodiments, spacing member 280 and sealing member 290 are constructed of the same materials and have equivalent or substantially equivalent thicknesses 320 and 322 (e.g., silicon, SU-8, silicon rubber, polymethylmethacrylate, etc.). In such embodiments, when actuating beam 240 extends parallel to orifice plate 250, lower surfaces of spacing member 280 and sealing member 290 are aligned with one another. When actuating beam 240 is placed into a closed position (as described herein), a surface of sealing member 290 contacts valve seat 270 to close the fluid outlet formed at orifice 260 (e.g., a sealing member surface of the sealing member 290 may be configured to extend approximately 2 microns beneath a lower surface of spacing member 280 if the valve seat 270 was not present). Valve seat 270 and sealing member 290 may be dimensioned such that sufficient surface area of the sealing member 290 contacts valve seat 270 when actuating beam 240 is placed in the closed position (e.g., when an electrical signal is removed from or applied to actuating beam 240 via wire bonds) to prevent fluid from traveling from reservoir 300 to orifice 260. For example, the sealing member 290 may have a larger diameter or otherwise cross-section than the valve seat 270.

Various aspects of jetting assembly 200 are designed to ensure formation of an adequate seal between valve seat 270 and sealing member 290. For example, structural layer 222 disposed on input fluid manifold 210 prevents bowing of orifice plate 250 resulting from stressed induced thereon via adhesives coupling components of micro-valve 230 to one another and the micro-valve 230 to housing portion 206. In various embodiments, structural layer 222 is constructed to have a greater rigidity than orifice plate 250 to perform this function. Structural layer 222 may be constructed of silicon or any other suitable material. As shown, structural layer 222 includes protruding portions 224 extending from a main portion thereof. Protruding portions 224 are attached to an upper surface of input fluid manifold 210 (e.g., at boundaries of first and second channels 212 and 214). In certain embodiments, protruding portions 224 are omitted. A seal is formed at protruding portions 224 via, for example, an adhesive disposed between structural layer 222 and flex circuit 216. Protruding portions 224 provide clearance above the input fluid manifold 210. Such clearance facilitates disposal of encapsulant 218 that completely covers all points of contact between wire bond 220 and flex circuit 216. In some embodiments, the carrier 202 include the structural layer 222 such that the stiffness is provided by the carrier 202.

In another aspect, actuating beam 240 is constructed such that a tight seal is formed at the interface between valve seat 270 and sealing member 290 when in the closed position. Actuating beam 240 may include at least one layer of piezoelectric material. The layer of piezoelectric material may include lead zirconate titanate (PZT) or any suitable material. The layer of piezoelectric material has electrodes electrically connected thereto. In various embodiments, wire bonds 220 are attached to said electrodes such that electrical signals from flex circuit 216 are provided to the layer of piezoelectric material via the electrodes. The electrical signals cause the actuating beam 240 to move (e.g., bend, turn, etc.) with respect to its default position. In other embodiments, the actuating beam 240 may include a stainless steel actuating beam (e.g., having a length of approximately 1 mm). In still other embodiments, the actuating beam 240 may include a bimorph beam having a two layers of a piezoelectric material disposed on either side of a base layer (e.g., a base silicon layer). An electrical signal (e.g., an electrical voltage) may be applied to either one of the piezoelectric layers so as to urge the actuating beam 240 to bend towards the corresponding piezoelectric layer. The two piezoelectric layers may include the same piezoelectric material or different piezoelectric materials. In particular embodiments, a different electrical signal may be applied to each of the piezoelectric layer so as to bend or curve the actuating beam a predetermined distance.

As shown, wire bonds 220 are attached to actuating beam 240 at an electrical connection portion 294 thereof. Electrical connection portion 294 includes a wire-bonding pad (e.g., constructed of gold or platinum) conductively connected to at least one electrode within actuating beam 240. Beneficially, electrical connection portion 294 is separated from the cantilevered portion 308 of actuating beam 240. In other words, electrical connection portion 294 is separated from the fluid contained in jetting assembly 200 via seals formed at the points of connection between input fluid manifold 210 and actuating beam 240. In some embodiments, the wire bonds 220 and/or the encapsulant 218 may be routed out through an opening provided in the orifice plate 250.

In various embodiments, actuating beam 240 is constructed such that the closed position is its default position. In other words, various layers in the actuating beam 240 are constructed such that the actuating beam 240 curves towards orifice 260 as a result of force supplied via pressurized fluid contained in the reservoir 300. A tuning layer within actuating beam 240 may be constructed to be in a state of compressive stress to cause a curvature in actuating beam 240 towards the orifice 260. As a result of such curvature, sealing member 290 contacts valve seat 270 in the absence of any electrical signals applied to the actuating beam 240 to close the orifice 260. The degree of curvature may be specifically selected to form a tight seal at the interface between sealing member 290 and valve seat 270 with the actuating beam 240 in the default position. Beneficially, such a default seal prevents evaporation of the fluid contained in jetting assembly 200, which prevents clogging and other defects.

The actuating beam 240, as shown in FIG. 5A, is bent away from orifice plate 250. Accomplishment of such a bend results from application of an electrical signal to actuating beam 240 via flex circuit 216. For example, flex circuit 216 may be electrically connected to an external controller supplying electrical signals relayed to actuating beam 240.

As illustrated by FIG. 5A, application of the electrical signal causes the actuating beam 240 to temporarily depart from its default position. For example, in various embodiments, the actuating beam 240 moves upward away from orifice 260 such that a portion of a sealing member surface of sealing member 290 is at least 10 microns from an upper surface of valve seat 270. In one embodiment, a central portion of the sealing member surface is approximately 15 microns from the valve seat 270 at a peak of its oscillatory pattern. As a result, an opening is temporarily formed between valve seat 270 and sealing member 290. The opening provides a pathway for a volume of fluid to enter orifice 260 to form a droplet at an exterior surface of the orifice plate 250. The droplets are deposited onto a substrate to form a pattern determined via the control signals supplied to each of the actuating beams 240 of each of the micro-valves 230 of jetting assembly 200. As will be appreciated, the frequency with which the actuating beam 240 departs from its default position to a position such as the one shown in FIG. 5 may vary depending on the implementation. In various embodiments, the natural frequency of the actuating beams 240 may be in a range of a 1-30 kHz, and may be dependent on a length, a width, a thickness and/or a stiffness of the actuating beam 240. For example, in one embodiment, the actuating beam 240 oscillates at a frequency of approximately 12 kHz. However, the actuating beam 240 may oscillate at a smaller (e.g., 10 kHz) or larger frequency (e.g., 20 kHz) in other implementations.

Figure 5B:
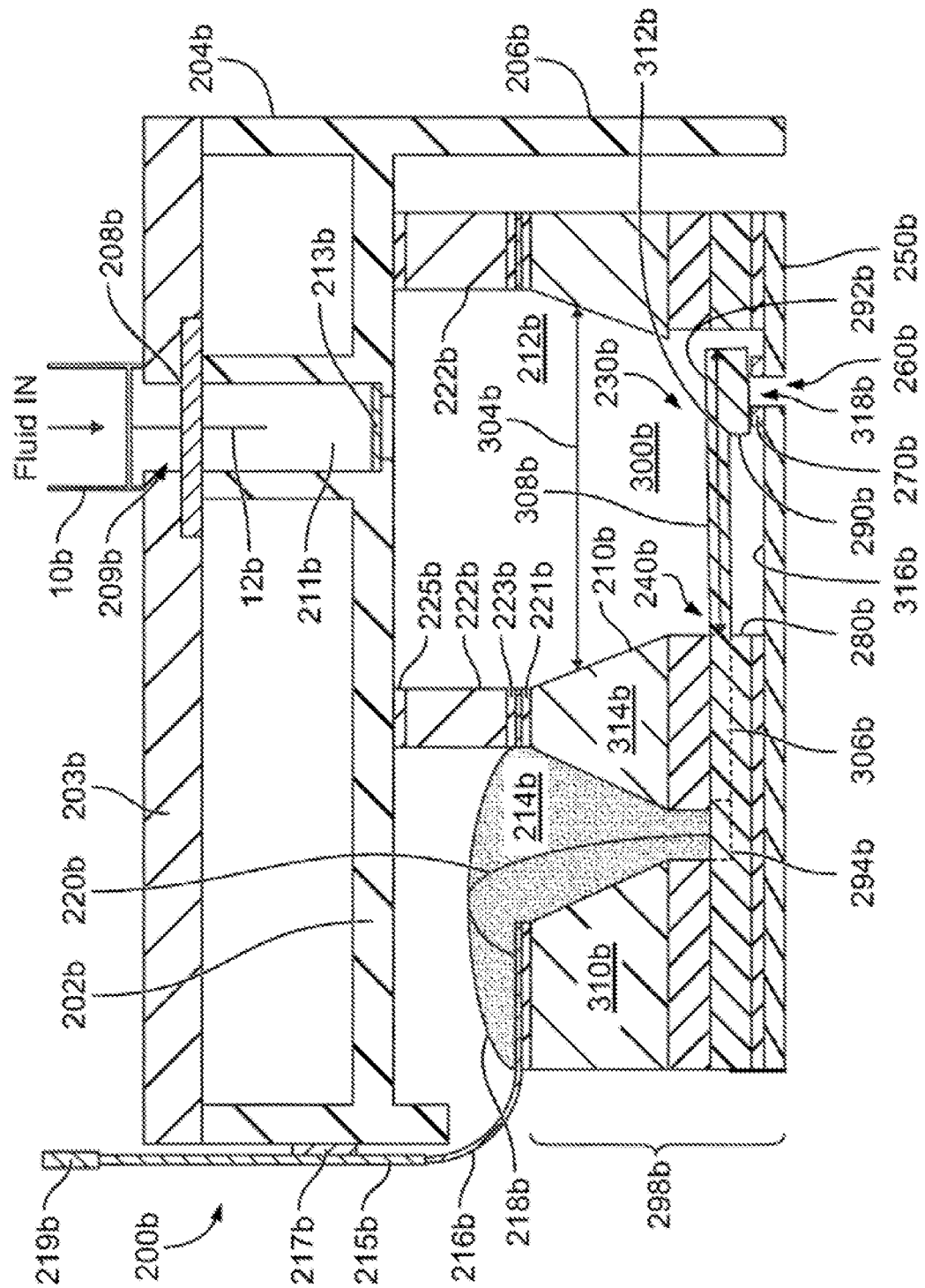
FIG. 5B is a-cross sectional view of a jetting assembly including a micro-valve, according to another example embodiment.

Referring now to FIG. 5B, a cross sectional view of a jetting assembly 200b including a micro-valve 230b is shown, according to an example embodiment. In some embodiments, jetting assembly 200b is an example embodiment of the jetting assembly 100 described with respect to FIGS. 1, 2, 3, and 4. As shown, jetting assembly 200b includes a carrier 202b attached to a valve body 298b via an interposer 222b.

Carrier 202b includes an upper portion 204b and a housing portion 206b extending from an edge of upper portion 204b. A fluid channel 211b is provided in the upper portion 204b. A septum 208b (e.g., a rubber or foam septum) is positioned at an inlet of the fluid channel 211b and a filter 213b is positioned at an outlet of the fluid channel 211b. A cover 203b (e.g., a plastic or glass cover) is positioned on the carrier 202b such that the septum 208b is positioned between the carrier 202b and the cover 203b, and secured therebetween. An opening 209b may be defined in the cover 203b and corresponds to the inlet of the fluid channel 211b. A fluid connector 10b is coupled to the cover 203b or the inlet of the fluid channel 211b. The fluid connector 10b includes an insertion needle 12b configured to pierce the septum 208b and be disposed therethrough in the fluid channel 211b. The fluid connector 10b is configured to pump pressurized fluid into an input fluid manifold 210b of the jetting assembly 200b via the insertion needle 12b. Furthermore, the filter 213b is configured to filter particles from the fluid before the fluid is communicated into the fluid manifold 210b. In some embodiments, the insertion needle 12b may be formed from or coated with a non-wetting (e.g., a hydrophobic material such as Teflon). In other embodiment, the insertion needle 12b may include heating elements, or an electric current may be provided to the insertion needle 12b so as to heat the insertion needle 12b and thereby, the fluid flowing therethrough into the input fluid manifold 210b. In still other embodiments, metallic needles or any other heating element may be provided in the input fluid manifold 210b for heating the fluid contained therein.

The housing portion 206b defines a cavity or a boundary within which the valve body 298b is disposed. Valve body 298 includes the input fluid manifold 210b and the micro-valve 230b. As shown, input fluid manifold 210b and micro-valve 230b define a reservoir 300b configured to hold a volume of pressurized fluid received from an external fluid supply via the septum 208b. In various embodiments, the pressurized fluid held within the reservoir 300b includes inks, paints, solvents, biological solutions, biochemical solutions, chemical solutions, physiological fluids (e.g., blood, urine, saliva, plasma, cerebrospinal fluid) adhesives, powders, gels, dyes, cell stains, a colloidal solution, a suspension, an emulsion, or any other suitable fluid.

In various embodiments, input fluid manifold 210b is pre-formed prior to its attachment to the additional components of the jetting assembly 200b. For example, fluid manifold 210b may be formed by a glass body 310b having any suitable thickness (e.g., 500 microns). As shown, input fluid manifold 210b is pre-formed to include a first channel 212b and a second channel 214b. First channel 212b is formed to have a width 304b bearing a predetermined relationship to a length 312b of a cantilevered portion 308b of an actuating beam 240b of the micro-valve 230b. Second channel 214b provides an avenue for an electrical connection to be formed between the actuating beam 240b and a flex circuit 216b via wire bonds 220b extending in between.

As shown, second channel 214b is substantially filled with an encapsulant 218b. The encapsulant 218b ensures the maintenance of an adequate electrical connection between flex circuit 216b and actuating beams 240b to facilitate providing electrical control signals to actuating beams 240b to cause movement thereof to open and close micro-valve 230b, and protects a wire-bond 220b from physical damage or moisture, as previously described herein.

The portion 314b of input fluid manifold 210b separating the first and second channels 212b and 214b serves as a barrier preventing fluid contained in the reservoir 300b from reaching the electrical connections. As such, input fluid manifold 210b serves as both part of the reservoir 300b for pressured fluid received from an external fluid supply and an insulating barrier between the pressured fluids and any electrical connections contained within jetting assembly 200b.

The micro-valve 230b includes an orifice plate 250b attached to actuating beam 240b. Orifice plate 250b is substantially planar and includes an orifice 260b extending between surfaces thereof. A valve seat 270b is disposed on an internal surface 316b of orifice plate 250b proximate to orifice 260b. Valve seat 270b defies an interior opening 318b substantially aligned with orifice 260b to create an outlet for pressurized fluid contained in the reservoir 300b. In particular embodiments, the valve seat 270b might be excluded such that a sealing member surface of the sealing member 290 contacts orifice plate 250b around the orifice 260b to seal the orifice 260b and close the micro-valve 230b.

The actuating beam 240b includes a base portion 306b and a cantilevered portion 308b. Base portion 306b extends underneath the portion 314b of input fluid manifold 210b separating the first and second channels 212b and 214b. As shown, the base portion 306b includes an electrical connection portion 294b in a region that overlaps with the second channel 214b. Electrical connection portion 294b includes an electrode through which an electrical connection is formed with flex circuit 216b via wire bonds 220b. The cantilevered portion 308b extends into the reservoir 300b from the portion 314b of input fluid manifold 210b. As shown, cantilevered portion 308b is disposed on a spacing member 280b and, as a result, is spatially separated from orifice plate 250b.

Cantilevered portion 308b has a length 312b such that the cantilevered portion 308b extends from a boundary of the reservoir 300b by a predetermined distance. In various embodiments, the predetermined distance is specifically selected such that a portion 292b of cantilevered portion 308b overlaps the valve seat 270b and orifice 260b. A sealing member 290b extends from the portion 292b of the actuating beam 240b overlapping the orifice 260b. In some embodiments, sealing member 290b is constructed to have a shape that substantially corresponds to a shape of orifice 260b.

The flex circuit 216b is positioned on the glass body 310b and the portion 314b of the input fluid manifold 210b, and coupled thereto via a first adhesive layer (e.g., SU-8, silicone rubber, etc.). An interposer 222b is positioned between the upper portion 204b of the carrier 202b and the input fluid manifold 210b so as to create gap between the upper portion 204b and the input fluid manifold 210b. This allows sufficient space for disposing the encapsulant 218 and increases a volume of the input fluid manifold 210b. As shown in FIG. 5B, the interposer 222b is positioned on and coupled to a portion of the flex circuit 216b via a second adhesive layer 223b (e.g., SU-8, silicone, or any other adhesive). Furthermore, the interposer 222b is coupled to a side wall of the upper portion 204b of the carrier 202b proximate to the micro-valve 230b via a third adhesive layer 225b (e.g., SU-8, silicone, or any other adhesive).

The interposer 222b may be formed from a strong, flat and rigid material (e.g., plastic, silicon, glass, ceramics, etc.) and disposed on input fluid manifold 210b so as to prevent bowing of the orifice plate 250b resulting from stressed induced thereon via adhesives coupling components of micro-valve 230b to one another and the micro-valve 230b to housing portion 206b. In various embodiments, interposer 222b is constructed to have a greater rigidity than orifice plate 250b to perform this function.

In another aspect, actuating beam 240b is constructed such that a tight seal is formed at the interface between valve seat 270b and sealing member 290b when in the closed position. Actuating beam 240b may include at least one layer of piezoelectric material (e.g., lead zirconate titanate (PZT) or any suitable material). The layer of piezoelectric material has electrodes electrically connected thereto and wire bonds 220b are attached to said electrodes such that electrical signals from flex circuit 216b are provided to the layer of piezoelectric material via the electrodes. The electrical signals cause the actuating beam 240b to move (e.g., bend, turn, etc.) with respect to its default position.

As shown, wire bonds 220b are attached to actuating beam 240b at an electrical connection portion 294b thereof, substantially similar to the wire bonds 220 described with respect to the jetting assembly 200 of FIG. 5A. In various embodiments, actuating beam 240b is constructed such that the closed position is in its default position, as described in detail with respect to the actuating beam 240 of FIG. 5A.

The actuating beam 240b, as shown in FIG. 5B, is bent away from orifice plate 250b. Accomplishment of such a bend results from application of an electrical signal to actuating beam 240b via flex circuit 216b. For example, flex circuit 216b may be electrically connected to a circuit board 215b (e.g., a printed circuit board) extending perpendicular to a longitudinal axis of the actuating beam 240b along a sidewall of the carrier 202b. An identification tag 217b (e.g., the identification tag 106) may be positioned between the circuit board 215b and the sidewall of the carrier 202b. An electrical connector 219b is electrically coupled to the circuit board 215b and configured to electrically connect the flex circuit 216b to an external controller supplying electrical signals relayed to actuating beam 240b via the circuit board 215b.

As illustrated by FIG. 5B, application of the electrical signal causes the actuating beam 240b to temporarily depart from its default position. For example, in various embodiments, the actuating beam 240b moves upward away from orifice 260b such that a portion of a sealing member surface of sealing member 290b is at least 10 microns from an upper surface of valve seat 270b, as described in detail with respect to the actuating beam 240 of FIG. 5A.

Figure 6:
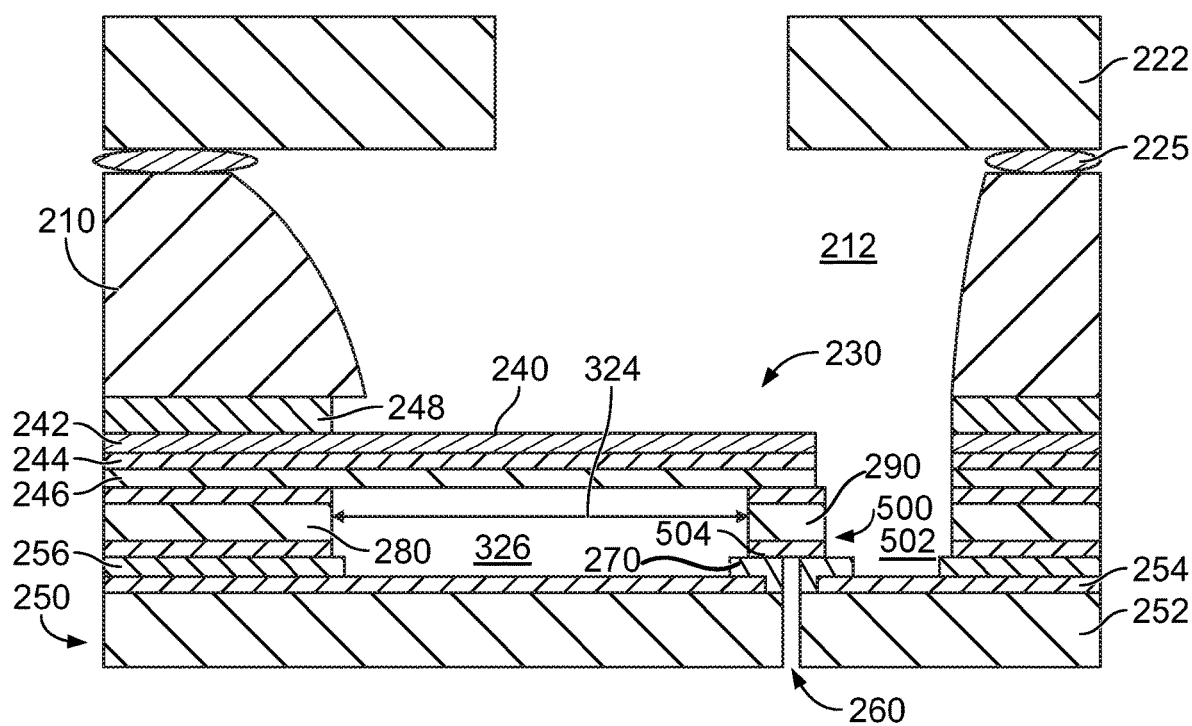
FIG. 6 is cross-sectional view providing a more detailed view of the jetting assembly shown in FIG. 5.

Referring now to FIG. 6, a more detailed view showing various components of jetting assembly 200 described with respect to FIG. 5A is shown, according to an exemplary embodiment. As shown, actuating beam 240 includes an actuating portion 242, a tuning layer 244, and a non-active layer 246. Non-active layer 246 serves as a base for the tuning layer 244 and the actuating portion 242. The structure of actuating portion 242 and the tuning layer 244 are described in greater detail with respect to FIGS. 7A-7B. In some embodiments, non-active layer 246 is constructed from silicon or other suitable material. In some embodiments, non-active layer 246, the spacing member 280, and sealing member 290 are all constructed from the same material (e.g., monolithically formed from a silicon wafer). In an example embodiment, non-active layer 246, the spacing member 280, and sealing member 290 are formed from a double silicon-on-insulator (SOI) wafer.

Spacing member 280 is shown to include an intermediate layer interposed between two peripheral layers. In an example embodiment, the intermediate layer and non-active layer 246 comprise two silicon layers of a double SOI wafer, with the peripheral layers disposed on either side of the intermediate layer including silicon oxide layers. In this example, the sealing member 290 and spacing member 280 are formed through etching the surface of the double SOI wafer opposite the actuating portion 242. Oxide layers serve to control or stop the etching process once, for example, the entirety of the intermediate layer forming the spacing member 280 is removed in a region separating the spacing member 280 and sealing member 290. Such a process provides precise control over both the width and thickness of the spacing and sealing members 280 and 290.

As will be appreciated, the size of sealing member 290 may contribute to the resonance frequency of actuating beam 240. Larger amounts of material disposed at or near an end of actuating beam 240 generally results in a lower resonance frequency of actuating beam. Additionally, such larger amounts of material may impact the actuating beam 240's default curvature induced from pressurized fluid contacting actuating beam 240. Accordingly, the desired size of sealing member 290 impacts various other design choices of actuating beam 240. Such design choices are described in greater detail with respect to FIG. 7A. In some embodiments, the sealing member 290 is sized based on the dimensions of orifice 260. In some embodiments, the sealing member 290 is substantially cylindrical and has a diameter approximately 1.5 times that of the orifice 260. For example, in one embodiment, sealing member 290 has a diameter of approximately 90 microns when the orifice 260 has a diameter of approximately 60 microns. Such a configuration facilitates alignment between sealing member 290 and orifice 260 such that sealing member 290 completely covers orifice 260 upon contacting valve seat 270. In another embodiment, the sealing member 290 is sized such that it has a surface area that approximately doubles that of orifice 260 (e.g., the spacing member 280 may have a diameter of approximately 150 microns, with the orifice 260 being approximately 75 microns in diameter). Such an embodiment provides greater tolerance for aligning sealing member 290 and orifice 260 to facilitate creating the seal between valve seat 270 and sealing member 290. In other embodiments, the diameter of the sealing member 290 may be 2 times, 2.5 times, 3 times, 3.5 times or 4 times to the diameter of the orifice 260. In various embodiments, a ratio of a length to diameter of the orifice 260 may be in range of 1:1 to 15:1. The ratio may influence shape, size and/or volume of a fluid droplet ejected through the orifice 260 and may be varies based on a particular application.

Beneficially, the gap 324 between spacing member 280 and sealing member 290 creates a volume of separation 326 between actuating beam 240 and orifice plate 250. The volume of separation 326 prevents squeeze film damping of oscillations of actuating beam 240. In other words, insufficient separation between orifice plate 250 and actuating beam 240 would lead to drag resulting from air having to enter and/or exit the volume of separation 326 as the actuating beam 240 opens and closes the orifice 260. Having the greater volume of separation produced via spacing member 280 reduces such drag and therefore facilitates actuating beam 240 oscillating at faster frequencies.

With continued reference to FIG. 6, orifice plate 250 includes a base layer 252 and intermediate layer 254. For example, in one embodiment, base layer 252 comprises a silicon layer and intermediate layer 254 includes a silicon oxide layer. In the embodiment shown, a portion of the intermediate layer 254 proximate to orifice 260 is removed and a first portion of the valve seat 270 is disposed directly on base layer 252 and a second portion of the valve seat 270 is disposed on the intermediate layer 254. It should be understood that, in alternative embodiments, intermediate layer 254 extends all the way to boundaries of orifice 260 and valve seat 270 is disposed on intermediate layer 254. In still other embodiments, the removed portion of the intermediate layer 254 may have a cross-section equal to or greater than a cross-section of the valve seat 270 such that the valve seat 270 is disposed entirely on the base layer 252.

Due to the criticality of the spatial relationship between spacing member 280 and valve seat 270, attachment of spacing member 280 to orifice plate 250 is performed in a manner allowing precise control over the resulting distance in between actuating beam 240 and orifice plate 250. As shown, an adhesive layer 256 is used to attach spacing member 280 to orifice plate 250. In various embodiments, a precise amount of epoxy-based adhesive (e.g., SU-8, polymethylmethacrylate, silicone, etc.) is applied to intermediate layer 254 prior to placement of the combination of spacing member 280 and actuating beam 240 thereon. The adhesive is then cured to form an adhesive layer 256 having a precisely controlled thickness. For example, in some embodiments, a lower-most surface of spacing member 280 is substantially aligned with an upper surface of valve seat 270. Any desired relationship between such surfaces may be obtained to create a relationship between sealing member 290 and valve seat 270 that creates an adequate seal when actuating beam 240 is in the default position. In various embodiments, the adhesive layer 256 and the valve seat 270 may be formed from the same material (e.g., SU-8) in a single photolithographic process.

In various embodiments, once the actuating beam 240 and orifice plate 250 are attached to one another via adhesive layer 256 (e.g., to form micro-valve 230), an additional adhesive layer 248 is applied to the periphery of the actuating beam 240. The additional adhesive layer 248 is used to attach input fluid manifold 210 to actuating beam 240. An interposer (e.g., the interposer 222b) may be positioned on the input fluid manifold 210 and coupled thereto via a second adhesive layer 225. In some embodiments, the additional adhesive layer 248 and the second adhesive layer 225 may include the same material as the adhesive layer 256.

Figure 7A:
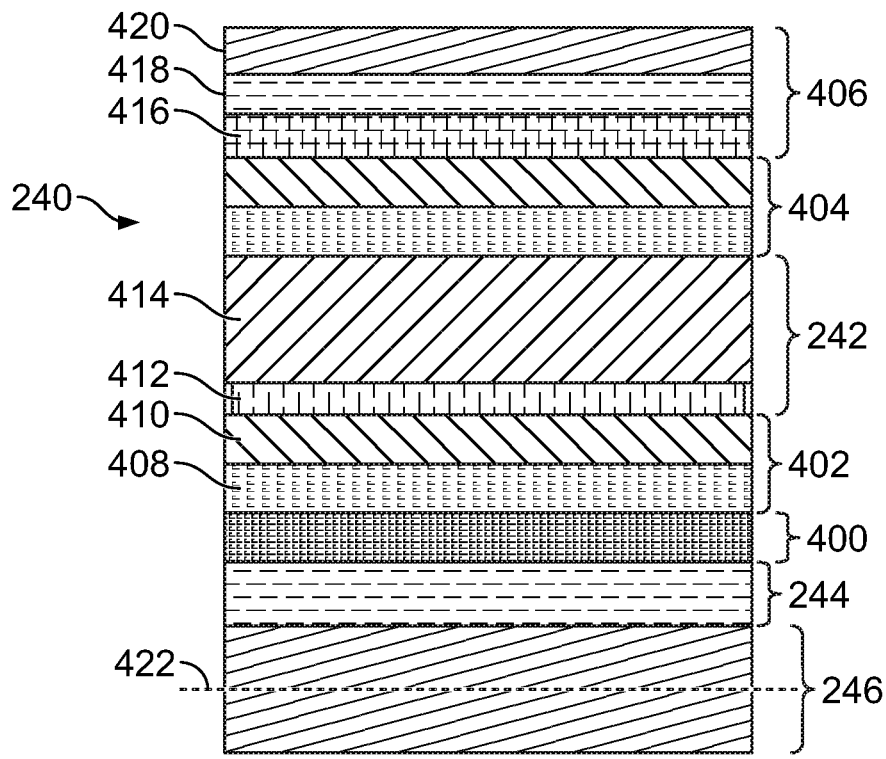
FIG. 7A is a cross-sectional view of an actuating beam of a micro-valve, according to an example embodiment.

Referring now to FIG. 7A, a more detailed view of actuating beam 240 is shown, according to an example embodiment and not to scale. As shown, actuating beam 240 includes the non-active layer 246, the tuning layer 244, a barrier layer 400, a first electrode portion 402, the actuating portion 242, a second electrode portion 404, and a passivation structure 406. As will be appreciated, actuating beam 240 may include more or fewer layers in various alternative embodiments.

In some embodiments, tuning layer 244 is disposed directly on non-active layer 246. Tuning layer 244 generally serves as an adhesion layer for facilitating deposition of the additional layers described herein. Additionally, as described herein, a thickness of tuning layer 244 may play a critical role in determining an overall curvature in actuating beam 240 when in its default position. Speaking generally, tuning layer 244 is configured to have a predetermined tuning stress such that in the closed position, the sealing member 290 of the actuation beam 240 contacts and exerts a force on the valve seat 270 so as to fluidly seal the orifice 260. In some embodiments, in the absence of an electrical signal, the predetermined tuning stress is configured to cause the actuating beam 240 to curve towards the orifice 260 such that in the absence of the valve seat 270, the sealing member surface of the sealing member 290 would be positioned a predetermined distance (e.g., 2 microns) beneath a lower surface of the spacing member 280. For example, the tuning layer 244 may be placed into a state of compressive stress as a result of the deposition of the additional layers described herein. As such, the thicker tuning layer 244 is, the greater curvature of actuating beam 240 towards orifice 260 when in its default position.

Barrier layer 400 acts as a barrier against diffusion of materials contained in the first piezoelectric layer 414 to the tuning layer 244. If left unchecked, such migration may lead to harmful mixing effects between constituent materials in the layers, adversely impacting performance. In various embodiments, barrier layer 400 is constructed of, for example, zirconium oxide or zirconium dioxide. As shown, first electrode portion 402 includes an adhesion layer 408 and a first electrode 410. The adhesion layer 408 facilitates deposition of the first electrode 410 on barrier layer 400 and prevents diffusion of matter in the first electrode 410 to other layers. In various embodiments, adhesion layer 408 is constructed of titanium. First electrode 410 may be constructed of platinum or gold to provide a conductive pathway for electrical signals to be provided to actuating portion 242. In some embodiments, first electrode portion 402 is only included in select portions of actuating beam 240. For example, first electrode portion 402 may only be included proximate to and/or within the electrical connection portion 294.

Actuating portion 242 may be formed from a single or multiple layers of any suitable piezoelectric material. In the example shown, active portion includes a growth template or seed layer 412 and a piezoelectric layer 414. Growth template layer 412 serves as a seed layer facilitating growth of the piezoelectric layer 414 having a desired texture (e.g., the {001} crystal structure and corresponding texture) to ensure maximal piezoelectric response. In some embodiments, growth template layer 412 is constructed of lead titanate. Piezoelectric layer 414 may be constructed of any suitable material, such as lead zirconate titanate (PZT).

Piezoelectric layer 414 may be deposited using any method, such as, utilizing vacuum deposition or sol-gel deposition techniques. In some embodiments, piezoelectric layer 414 may have a thickness in a range of approximately 20-200 microns (e.g., 20, 30, 40, 50, 60, 70, 80, 90, 100, 120, 140, 160, 180 or 100 microns and is adapted to produce a deflection at an end of actuating beam 240 of approximately 10 microns when an electrical signal is applied thereto. A deflection of 10 microns (e.g., such that a s-urface of sealing member 290 departs from valve seat 270 by slightly less than that amount) may be sufficient to produce droplets at orifice 260 having a desired size. In some embodiments, piezoelectric layer 414 has a piezoelectric transverse coefficient (d31 value) magnitude of approximately 140 to 160 pm/V. This value may enable adequate deflection of actuating beam 240 to be generated via electrical signals supplied to first and second electrode portions 402 and 404.

As shown, second electrode portion 404 is disposed on actuating portion 242. In various embodiments, second electrode portion 404 is structured similarly to first electrode portion 402 described herein. Application of a voltage to the first electrode portion 402 and/or second electrode portion 404 thus induces a strain in piezoelectric layer 414, causing the entirety of actuating beam 240 to bend away from the orifice plate 250. Through application of periodic control signals to first and second electrode portions 402 and 404, periodic cycling of actuating beam 240 generates droplets output from orifice 260 at a desired frequency. While FIG. 7A shows the first and second electrode portions 402 and 404 overlapping each other, in other locations, the first and second electrode portions 402 and 404 may not overlap. This may limit or prevent electron leakage between the first and second electrode portions 402 and 404 which can damage the piezoelectric layer 414 or cause electrical shorts.

The materials shown in FIG. 7A may extend substantially entirely through the length of actuating beam 240. As such, there is an overlap between electrode portions 402 and 404 and the reservoir formed via micro-valve 230. In various embodiments, the fluid contained in the reservoir 300 is electrically conductive and/or corrosive to the materials forming the first and second electrode portions 402 and 404. Thus, it is preferable to isolate electrode portions 402 and 404 from the fluid reservoir 501 to prevent the fluid contained in the reservoir 300 from contacting electrode portions 402 and 404.

In this regard, the passivation structure 406 is configured to perform such isolation. In the example shown, passivation structure 406 includes a dielectric layer 416, an insulator layer 418, and a barrier layer 420. Barrier layer 420 may be constructed of silicon nitride, which acts as a diffusion barrier against water molecules and ions contained in the fluid to prevent corrosion of electrode portions 402 and 404. In some embodiments, insulator layer 418 includes a silicon dioxide layer having a compressive stress that roughly counterbalances the tensile stress in barrier layer 420. Dielectric layer 416 may be constructed of aluminum oxide to prevent oxidation of the additional layers contained in actuating beam 240. In some embodiments, an additional metal layer is disposed on barrier layer 420. For example, the metal layer may be constructed of Tantalum oxide or any other suitable, chemically-resistant metal to further enhanced the protective properties of passivation structure 406. In particular embodiments, the barrier layer 420 may be formed from Teflon or parylene. In other embodiments, at least a portion of the actuating beam 240, i.e., the structure formed by the layers shown in FIG. 7A may be covered or over coated by a Teflon or parylene layer. Such an overcoat may prevent micro-cracks from forming in the layers of the actuating beam 240. In still other embodiments, the over coat may include a metallic layer, for example, a tantalum or palladium layer.

The addition of passivation structure 406 may significantly impact the default positioning of actuating beam 240. This is so because passivation structure 406 is offset from a neutral axis 422 of compression of the actuating beam 240. As shown, the neutral axis 422 is within the non-active layer 246, which means that the electrode portion 404 and passivation structure 406 are the most distant therefrom in actuating beam 240. Given this, the tensile or compressive stresses induced in such layers will greatly influence the default curvature of actuating beam 240. As such, the thickness of tuning layer 244 is selected based on the structure of various constituent layers of passivation structure 406.

Figure 7B:
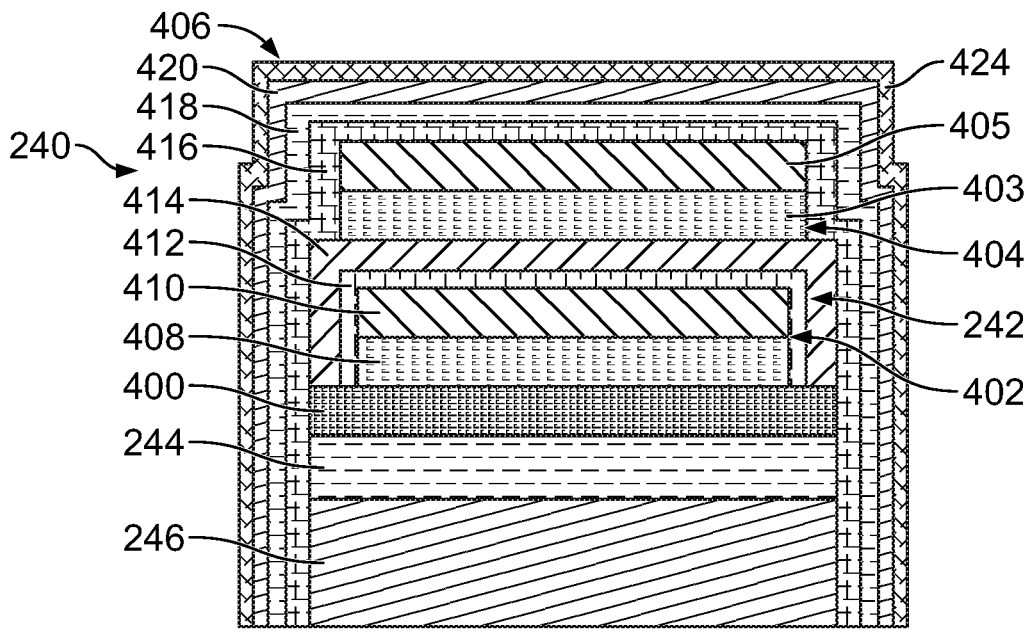
FIG. 7B is a front cross-sectional view of the actuating beam of FIG. 7A, according to another example embodiment.

FIG. 7B is front cross-sectional view of the actuating beam 240 showing an arrangement of each of the layers included in the actuating beam, according to an example embodiment and not to scale. As shown, actuating beam 240 includes the non-active layer 246, the tuning layer 244 and a barrier layer 400, as described with respect to FIG. 7A. The first electrode portion 402 includes the adhesion layer 408 (e.g., titanium oxide) positioned on the barrier layer 400, and a conductive layer or electrode 410 (e.g., platinum or gold) positioned thereon. The first electrode portion 402 is configured to have a width which is less than a width of the barrier layer 400 such that ends of the electrode portion 402 in a direction perpendicular to a longitudinal axis of the actuating beam 240 are located inwards of the ends of the barrier layer 400 in the same direction.

The actuating portion 242 including the seed layer 412 and the piezoelectric layer 414 is conformally disposed on the first electrode portion 402 so as to extend beyond the lateral ends of the first electrode portion 402 and contact the barrier layer 400. In this manner the piezoelectric layer completely surrounds or encapsulates at least the portion of the first electrode portion 402 which overlaps or is proximate to the second electrode portion 404. The second electrode portion 404 includes an adhesion layer 403 (e.g., titanium) and a conductive layer 405 (e.g., platinum or gold). In some embodiments, the second electrode portion 404 may include only the conductive layer 405 disposed directly on the piezoelectric layer 414 (i.e., the adhesion layer 403 is omitted). Since the actuation portion 242 overlaps and extends beyond the ends of the first electrode portion 402, the actuation portion effectively electrically isolates the first electrode portion 402 from the second electrode portion 404, so as to prevent electron leakage and current migration which may be detrimental to the performance of the actuating beam 240.

The passivation structure 406 conformally coats exposed portions of each of the other layers 246, 244, 400, 402, 242 and 404. However, a bottom surface of the non-active layer 246 may not be coated with the passivation structure 406. The passivation structure 406 may include a dielectric layer 416, an insulator layer 418, a barrier layer 420, and a top passivation layer 424. Barrier layer 420 may be constructed of silicon nitride, which acts as a diffusion barrier against water molecules and ions contained in the fluid to prevent corrosion of electrode portions 402 and 404. Silicon nitride, however, is generally in a state of tensile stress once deposited on the remaining layer. Insulator layer 418 is configured to counterbalance such tensile stress. For example, in some embodiments, insulator layer 418 includes a silicon dioxide layer having a compressive stress that roughly counterbalances the tensile stress in barrier layer 420. In various embodiments, the barrier layer 420 may be positioned beneath the insulator layer 418. Dielectric layer 416 may be constructed of aluminum oxide, titanium oxide, zirconium oxide or zinc oxide to prevent oxidation of the additional layers contained in actuating beam 240. Thus, passivation structure 406 serves to prevent both corrosion and oxidation—two major sources of defects caused by the presence of fluids—in actuating beam 240, and thus ensures long-term performance of micro-valve 230. Furthermore, the top passivation layer 424 is disposed on the barrier layer 420 and may include a Teflon or parylene layer. Such an overcoat may prevent micro-cracks from forming in the layers of the actuating beam 240, and may also prevent the underlying layer from a plasma discharge (e.g., which the buried layers may be exposed to in subsequent fabrication operations). In particular embodiments, the top passivation layer 424 may include a metallic layer, for example, a tantalum or palladium layer. In some embodiments, an additional metal layer is disposed on barrier layer 420. For example, the metal layer may be constructed of Tantalum oxide or any other suitable, chemically-resistant metal to further enhanced the protective properties of passivation structure 406.

Figure 8:
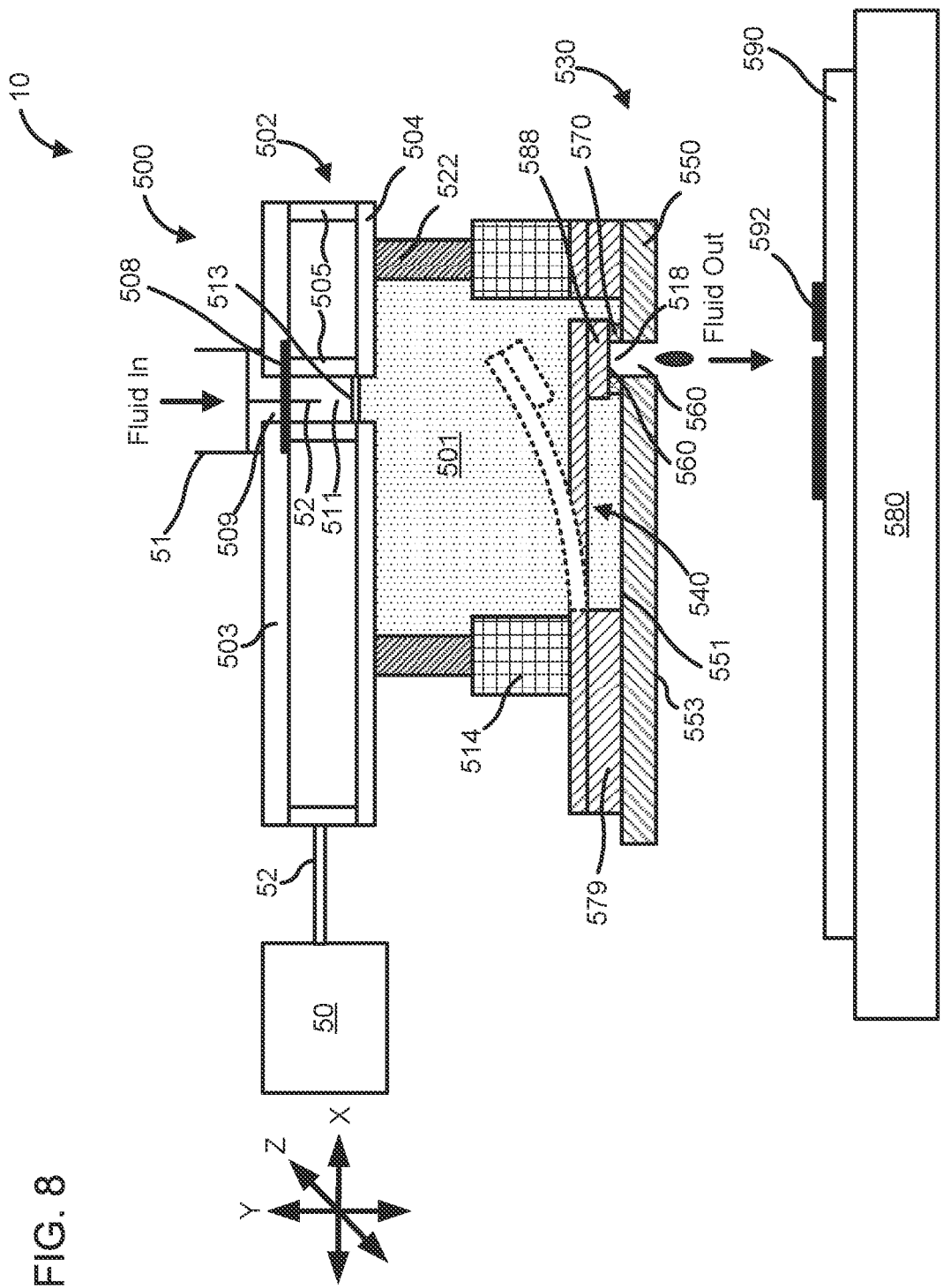
FIG. 8 is a schematic illustration of non-contact deposition system, according to an embodiment.

In some embodiments, a non-contact deposition system may include a jetting assembly, for example, any of the jetting assemblies described herein. For example, FIG. 8 is a schematic illustration of a non-contact deposition system 10 that includes a jetting assembly 500, according to an embodiment. The jetting assembly 500 includes a micro-valve 530 coupled to a carrier 504 via an interposer 522.

The micro-valve 530 includes an orifice plate 550 including a first surface 551 and a second surface 553 opposite the first surface 551. An orifice 560 extends from the first surface 551 to the second surface 553. The orifice plate 550 may be substantially similar to the orifice plate 250/250b and therefore, not described in further detail herein. In some embodiments, a valve seat 570 may surround the orifice 560. The valve seat 570 defines an opening 518 in fluid communication with the orifice 560. The valve seat 570 may be substantially similar to the valve seat 270/270b and therefore, not described in further detail herein.

A spacing member 579 is disposed on the first surface 551 and is offset from the orifice 560. An actuating beam 540 is disposed on the spacing member 579. The actuating beam 540 extends from the spacing member 579 towards the orifice 560. The actuating beam 540 comprises a layer of piezoelectric material and is movable between a closed position and an open position by applying an electrical signal to the layer of piezoelectric material. A sealing member 588 is disposed on an end portion of the actuating beam 540 and overlaps the orifice 560.

For example, when the layer of piezoelectric material does not have an electrical signal (e.g., a voltage or differential voltage) applied thereto, the actuating beam 540 is in the closed position (e.g., in its default state). In the closed position, a sealing member surface 589 of the sealing member 588 contacts the valve seat 570 (or the orifice plate 550 in embodiments which the micro-valve 530 does not include the valve seat 570) to seal the orifice 560 and close the micro-valve 530. In the open position, the actuating beam 540 bends or curves away from the orifice 560 such that the sealing member 588 no longer seals the orifice 560 and fluid may be ejected from orifice 560 towards the substrate 590. The actuating beam 540 may be substantially similar to the actuating beam 240/240b or any other actuating beam described herein and is therefore, not described in further detail herein.

A fluid manifold 514 is coupled to the micro-valve and defines a fluid reservoir 501 around the actuating beam 540. The fluid manifold 514 may be substantially similar to the fluid manifold 314/314b and therefore, not described in further detail herein. In some embodiments, a interposer 522 may be disposed on the fluid manifold 514 and coupled thereto. The interposer 522 may be substantially similar to the interposer 222b in structure and function and therefore, not described in further detail herein.

Furthermore, a carrier 502 may be disposed on the interposer 522 and coupled thereto such that the orifice plate 550, the fluid manifold 514, the interposer 522 and the carrier 502 collectively define a boundary of the fluid reservoir 501. Carrier 502 includes a base portion 504 disposed on the interposer 522 and coupled thereto so as to defined a portion of the boundary of the fluid reservoir 501. Sidewalls 505 extend from the base portion 504 away from the micro-valve 530 such that carrier defines a fluid channel 511 therethrough. A septum 508 (e.g., a rubber or foam septum) may be positioned at an inlet of the fluid channel 511 and a filter 513 may be positioned at an outlet of the fluid channel 511. A cover 503 (e.g., a plastic or glass cover) may be positioned on the sidewalls 505 such that the septum 508 is positioned between the sidewalls 505 forming the fluid channel 511 and the cover 503 and secured therebetween. An opening 509 may be defined in the cover 503 and corresponds to the inlet of the fluid channel 511. A fluid connector 51 may be coupled to the cover 503 or the opening 509 of the fluid channel 511 (e.g., via a fluidic coupler). The fluid connector 51 may include an insertion needle 52 configured to pierce the septum 508 and be disposed therethrough into the fluid channel 511. The fluid connector 51 is configured to provide pressurized fluid into the fluid reservoir 501 (e.g., pressurized via a pump positioned upstream of the fluid connector 51) via the insertion needle 52. Furthermore, the filter 513 is configured to filter particles from the fluid before the fluid is communicated into the fluid reservoir 501. In some embodiments, the carrier 502 and the needle 52 may be substantially similar to the carrier 202b and the needle 12b and therefore, not described in further detail herein.

While not shown in FIG. 8 for clarity, the jetting assembly 500 may include any other components as described with respect to the jetting assembly 200/200b. Such components may include, for example, flex circuit 216/216b, wire bonds 220/220b, encapsulant 218/218b, electrical connector 219b, circuit board 215b, or any other components as described with respect to the jetting assembly 200/200b. Such components may have the same structure, serve the same function and be disposed at the same locations as previously described herein. It should be appreciated that while FIG. 8 shows the non-contact deposition system 10 as including a single jetting assembly 500, in other embodiments, the non-contact deposition system 10 may include a plurality of jetting assemblies 500. In such embodiments, each of the plurality of jetting assemblies 500 may be configured to deposit the same fluid on multiple corresponding substrates or deposit a plurality of fluids on the same, or different substrates.

In some embodiments, the non-contact deposition system 10 may also include a platform 580 spaced apart from the micro-valve 530 of the jetting assembly 500 on which the substrate 590 is positioned. In some embodiments, a motion mechanism 50 may be coupled to the jetting assembly 500 via a coupling member 52 (e.g., a coupling rod, shaft or frame). While shown as being coupled to the carrier 502, in other embodiments, the motion mechanism 50 may be coupled to the interposer 522, the fluid manifold 514 or any other portion of the jetting assembly 500. The motion mechanism 50 may include servo motors, a belt-rail assembly or any other components configured to provide 2 dimensional (in the X-Y plane) or 3 dimensional (in the X-Y-Z plane) motion to the jetting assembly 500 so as to allow deposition of the fluid at a predetermined location on the substrate 590. In other embodiments, the motion mechanism 50 may be additionally, or alternatively coupled to the platform 580 and configured to move the platform 580, and thereby the substrate 590 relative to the jetting assembly 500.

As previously described herein, the fluid reservoir 501 is filled with a pressurized fluid provided by the fluid connector 51 via the fluid channel 511. The fluid may be selectively ejected from the orifice 560 by applying an electrical signal (e.g., a differential voltage) to the actuating beam 540 causing the cantilevered portion of the actuating beam 540 to move away from the orifice 560 and open the micro-valve 530. A droplet of the fluid is ejected from the orifice 560 towards the substrate 590 and deposited thereon as a fluid deposit 592 (e.g., a droplet, a pattern, a mark, etc.).

The fluid may include any suitable fluid depending on the specific application that the non-contact deposition system 10 is being used for. The fluid may be a liquid, a gels, a powder or a colloidal solution. Suitable fluids may include, but are not limited to inks, paints, solvents, biological solutions, biochemical solutions, chemical solutions, physiological fluid, adhesives, powders, gels, dyes, cell stains, colloidal solutions, emulsions, suspensions, etc. In various embodiments, the fluid may include a volatile fluid (e.g., solvent based solutions such as inks, paint or adhesive) or an air sensitive fluid (e.g., fluid that containing components that are oxidized by oxygen in air). In some embodiments, the non-contact deposition system 10 may be configured to deposit a high viscosity fluid having a viscosity in a range of 5-20 centipoise without using an external pump to pressurize the fluid provided to the jetting assembly 500. Furthermore, the non-contact deposition system 10 may be able to deposit fluids having a viscosity up to 100 centipoise by a providing a pressurized fluid to the jetting assembly 500 (e.g., pumped by an external pump).

The jetting assembly 500 is structured to limit exposure of such fluids to air present in the environment outside the jetting assembly 500. For example, the default position of the micro-valve 530 may be the closed position as previously described herein. Therefore, the fluid contained within the fluid reservoir 501 is only exposed to air when the micro-valve 530 opens, thereby limiting air exposure. This may increase the life of the fluid and obviate the use of a controlled environment for performing deposition operation, therefore reducing cost.

Figure 9:
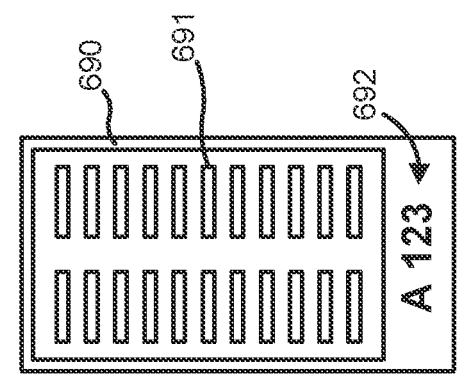

The substrate 590 may include any suitable substrate. FIGS. 9-14 are schematic illustrations of various substrates that may be used for depositing a fluid thereon using the non-contact deposition system 10. Referring to FIG. 9, in some embodiments, the substrate may include a histopathology cassette 690. The histo-pathology cassette 690 may include a plurality of slots 691, each configured to hold a different cell or tissue sample. In such embodiments, the fluid may include a cell stain and the non-contact deposition system 10 may be configured to deposit the same stain in each slot 691 or a different stain in different slots 691 (e.g., via a plurality of micro-valves included in the non-contact deposition system 10). In some embodiments, the fluid may comprise an ink and the non-contact deposition system 10 may be configured to deposit ink on the histo-pathology cassette 690 form a mark 692 (e.g., a logo, a bar code, a serial number, etc.) on the histo-pathology cassette 690.

Figure 10:
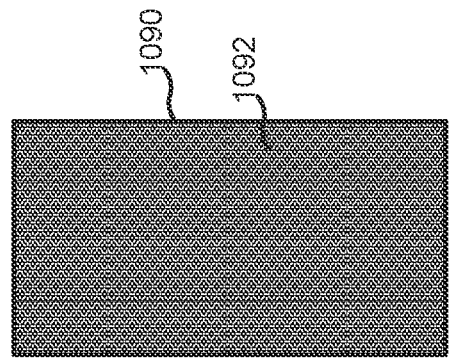

In some embodiments, the substrate may comprise a slide 790 shown in FIG. 10. For example, the slide 790 may include a microscope slide and may be formed from glass or plastic. In such embodiments, the fluid may comprise a chemical, a biological or biochemical solution. Biochemical or biological solutions may include, for example, solutions containing biomolecules, for example, proteins (e.g., antibodies, antigens, enzymes, protein fractions, etc.), oligonucleotides, DNA strands, cell lysate, etc., in a physiological buffer or solvent. In some embodiments, a gelling agent (e.g., a sol-gel or hydrogel) or a polymerizing agent may also be included in the solution. The non-contact deposition system 10 may be configured to deposit an array of droplets 794 of the solution (e.g., 500 pL to 10 nL volume droplets) on the slide 790 so as to form a microarray, which may be analyzed using fluorescent probes or any other suitable analysis technique. In some embodiments, the non-contact deposition system 10 may also be configured to deposit ink on the slide 790 to form a mark 792 (e.g., a logo, a bar code, a serial number, etc.) thereon.

Figure 11:
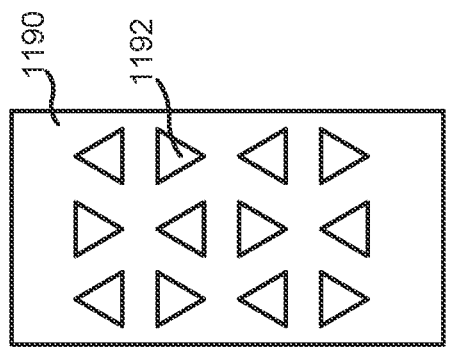
FIG. 9-14 are schematic illustrations of substrates and fluids deposited on such substrates by the system of FIG. 8, according to various embodiments.
Figure 14:
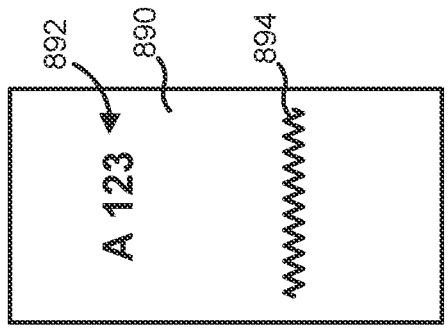
Figure 13:
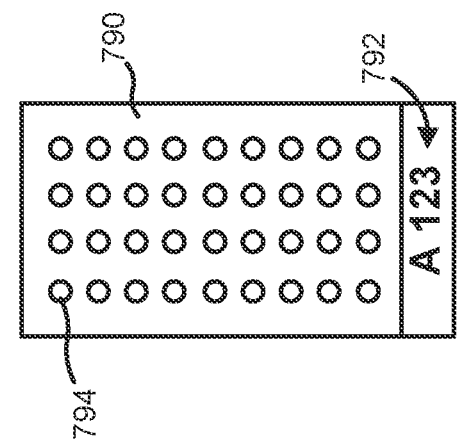

In other embodiments, the substrate may comprise a fabric (e.g., cotton, nylon, polyester, spandex, rayon, a carpet, etc.), a ceramic tile, engineered wood or laminate tile. In such embodiments, the non-contact deposition system 10 may be configured to deposit any suitable fluid thereon, for example, conductive ink (e.g., conductive silver ink, polyethylene dioxythiophene (PEDOT), polypyrole (PPy), etc.), paint, nanocoatings or anti-microbial coatings. For example, FIG. 11 shows a fabric 890 that may include a garment formed from any suitable material described herein. The non-contact deposition system 10 may be used to deposit conductive ink in a predetermined pattern on the fabric 890 to form an electrical component 894 (e.g., a resistor, electrode leads or contacts) on a surface of the fabric 890. Furthermore the non-contact deposition system 10 may also be configured to deposit ink on the fabric 890 to form a mark 892 thereon. Similarly, FIG. 13 shows a substrate 1090 which may include a fabric (e.g., cotton, nylon, polyester, spandex, rayon, a carpet, etc.), a ceramic tile, engineered wood or laminate tile and the non-contact deposition system 10 is used to deposit a coating 1092, for example, a nanocoating or an anti-microbial coating on the substrate 1090. FIG. 14 shows a substrate 1190 which may include a fabric (e.g., cotton, nylon, polyester, spandex, rayon, a carpet, etc.), a ceramic tile, engineered wood or laminate tile and the non-contact deposition system is configured to deposit an ink or paint on the substrate 1090 to form a pattern 1192 on the substrate 1090.

Figure 12:
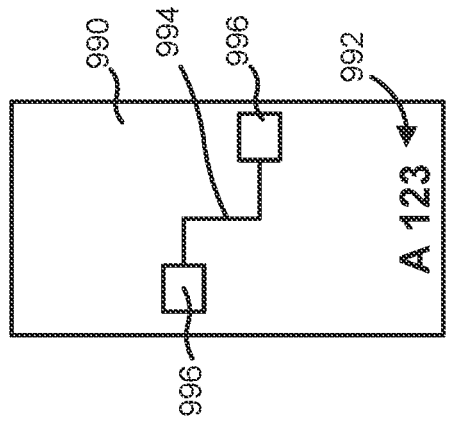

In some embodiments, the substrate may comprise a circuit board. For example, FIG. 12 shows a circuit board 990, for example, a printed circuit board (PCB). The non-contact deposition system 10 may be configured to deposit a conductive fluid e.g., conductive silver ink, polyethylene dioxythiophene (PEDOT), polypyrole (PPy), etc.), a semi-conducting fluid (e.g., hydrogenated amorphous silicon mixed with arsenic, selenium and/or tellurium) or a piezo-electric fluid so as to print circuits on the circuit board 990. For example, FIG. 12 shows an exemplary circuit comprising an electrode lead 994 between two contact points 996 printed on the circuit board 990 by the non-contact deposition system 10. In other embodiments, the non-contact deposition system 10 may also be used to deposit ink or paint on the circuit board 990, for example, to form a mark 992 on the circuit board 990. The non-contact deposition system 10 may be able to form multiplexed electrical connections on the circuit board 990.

In some embodiments, the non-contact deposition system 10 may also be able to print fruit and vegetable sticker or labels that are adhesively secured to a food item to provide various information (e.g., price, sell-by date, origin, etc.). For example, the non-contact deposition system 10 may be configured to deposit adhesives on such labels as well as print marks thereon.

In some embodiments, the fluid may comprise a polymer which may change its phase to a solid (e.g., a melted plastic which solidifies on cooling or liquid polymer which polymerized when exposed to air). In such embodiments, the non-contact deposition system 10 may be configured to deposit a plurality of layers of the polymer on the substrate 590 so as to form a 3-dimensional object having a predetermined shape. For example, the motion mechanism 50 may be configured to move the jetting assembly 500 along a predetermined path such that a plurality of layers of the polymer are deposited on the substrate sequentially to form the 3-dimensional object. In other words, the non-contact deposition system 10 may be used for 3-D printing.

Figure 15:
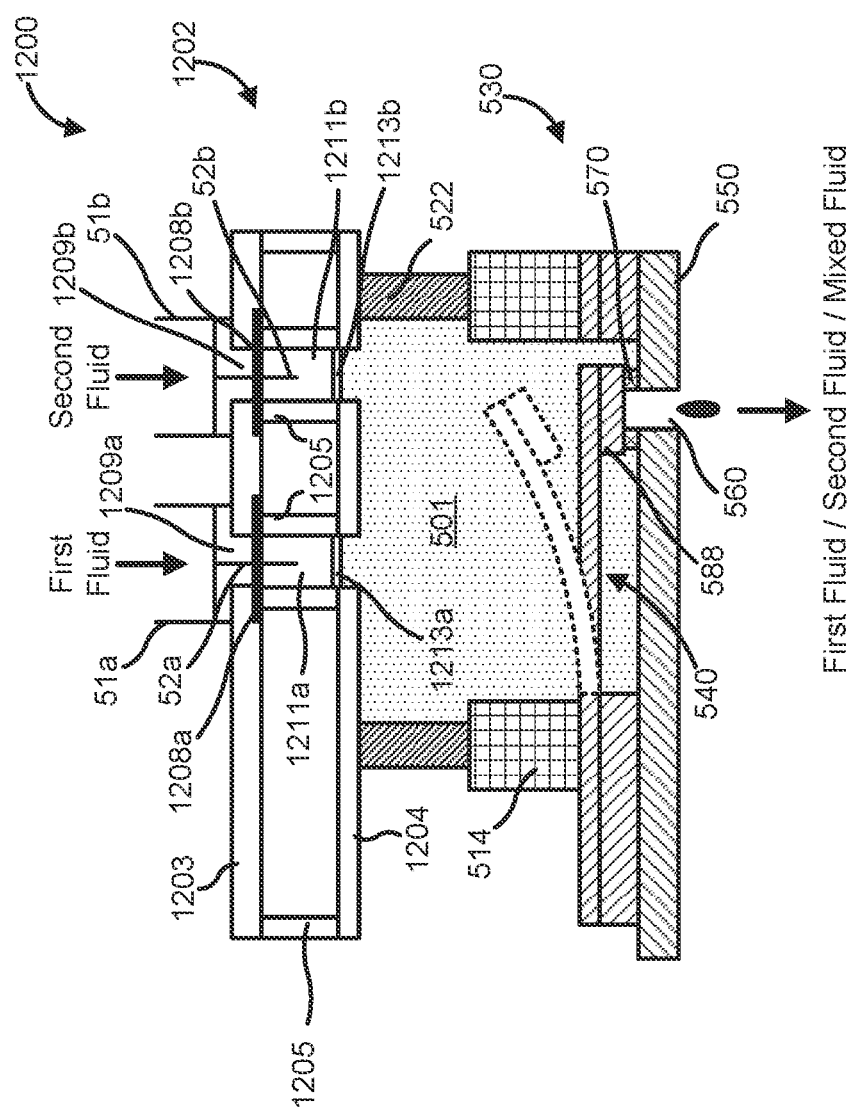
FIG. 15 is a schematic illustration of a jetting assembly which may be used in the non-contact deposition system of FIG. 8, according to an embodiment.

In some embodiments, a jetting assembly may be configured to receive a plurality of fluids. For example, FIG. 15 is a schematic illustration of a jetting assembly 1200 that may be used in the non-contact deposition system 10, according to an embodiment. The jetting assembly 1200 comprises the micro-valve 530 including the orifice plate 550 defining the orifice 560 therethrough, and the actuating beam 540 having the sealing member 588 disposed on a tip thereof overlapping the orifice 560, as previously described herein. Different from jetting assembly 500, the jetting assembly 1200 includes a carrier 1202 disposed on and coupled to the interposer 522 such that the orifice plate 550, the fluid manifold 514, the interposer 522 and the carrier 1202 collectively define a boundary of the fluid reservoir 501.

The carrier 1202 includes a base portion 1204 disposed on the interposer 522 and coupled thereto. Sidewalls 1205 extend from the base portion 1204 away from the micro-valve 530. However, different from jetting assembly 500, the sidewalls 1205 define a first fluid channel 1211a and a second fluid channel 1211b through the carrier 1202. A first septum 1208a is positioned at an inlet of the first fluid channel 1211a and a second septum 1208b is positioned at an inlet of the second fluid channel 1211b. Furthermore, a first filter 1213a and a second filter 1213b is positioned at an outlet of the first and second fluid channels 1211a and 1211b, respectively. A cover 1203 may be positioned on the sidewalls 1205 such that the septum 1208a/b is positioned between the sidewalls 1205 forming the fluid channels 1211a/b and the cover 1203, and secured therebetween. Openings 1209a/b are formed in the cover 1203 and correspond to the inlet of the fluid channel 1211a/b.

A first fluid connector 51a is coupled to first opening 1209a, and the a second fluid connect 51b is coupled to the second opening 1209b defined in the cover 1203 corresponding to the inlets of the first and second fluid channels 1211a and 1211b, respectively (e.g., via fluidic couplers). The fluid connectors 51a/b include corresponding insertion needles 52a/b configured to pierce the septums 1208a/b and be disposed therethrough into the fluid channels 1211a/b.

The first fluid connector 51a is configured to deliver a first fluid into the first fluid channel 1211a, and the second fluid connector 51b is configured to deliver a second fluid different from the first fluid into the second fluid channel 1211b. In this manner, the first fluid channel 1211a is configured to deliver the first fluid (e.g., an ink or paint having a first color) and the second fluid channel 1211b is configured to deliver the second fluid (e.g., an ink or paint having a second color different from the first color) into the fluid reservoir 501. The jetting assembly 1200 may be configured to selectively deposit the first fluid, the second fluid or a mixture thereof formed within the fluid reservoir 501 on the substrate (e.g., the substrate 590). For example, the first fluid may be selectively delivered through the first fluid connector 51a into the fluid reservoir 501 and deposited on a substrate (e.g., the substrate 590 or any other substrate described herein). Delivery of the first fluid through the first fluid connector 51a may be selectively stopped, and the second fluid may be then be delivered to the fluid reservoir 501 by the second fluid connector 51b. In other embodiments, each of the first and second fluid connectors 51a/b may simultaneously deliver the first and second fluids to the fluid reservoir 501 such that a mixture thereof is formed in the fluid reservoir 501. The mixture is then selectively deposited on the substrate by the micro-valve 530. While FIG. 15 shows the carrier as including two fluid channels 1211a/b, any number of fluid channels may be provided in the carrier 1202 such that any number of fluids may be delivered to the fluid reservoir 501 for depositing individually on the substrate or depositing a mixture of at least a portion thereof on the substrate.

The jetting assembly 1200 may be used in any suitable application to deposit fluids or mixtures thereof on a substrate. For example, in some embodiments, the substrate may include artificial fingernails or real fingernails. In such embodiments, the first fluid may comprise a first nail color and the second fluid may comprise a second nail color different from the first nail color. The jetting assembly 1200 may be configured to deposit a predetermined pattern of the first color, the second color or a mixture thereof on the real or artificial fingernails. In other embodiments, the substrate may comprise a mixing palette (e.g., a palette for mixing art colors or hair dyes), and the first and second fluids may include a powder, a liquid and/or a gel which are mixed within the reservoir 501 or deposited individually on the palette so they can be mixed thereon.

In some embodiments, a jetting assembly may include a predetermined supply of a fluid and a pressurizing mechanism for pressurizing the fluid within the fluid reservoir such that external fluid connectors are not needed. For example, a carrier of a jetting assembly may define an internal volume containing the fluid. The fluid may be contained in a compressible fluid container disposed within the internal volume and may be under constant pressure. In such embodiments, the carrier or a portion of the carrier may be removable For example, FIG. 16 is a schematic illustration of a jetting assembly 1300, according to an embodiment. The jetting assembly 1300 includes the micro-valve 530 and a carrier 1310 coupled to the micro-valve 530. The carrier 1310 comprises a carrier first portion 1302 that is coupled to the micro-valve 530. The carrier first portion 1302 may be substantially similar to the carrier 502 and therefore, not described in further detail herein. The carrier 1310 also comprises a carrier second portion 1320 disposed on and coupled to the carrier first portion 1302. The carrier second portion 1320 includes a carrier second portion housing 1322 defining an internal volume 1324. A compressible fluid container 1326 (e.g., a flexible bag or pouch containing the fluid) is disposed in the internal volume. A needle 1321 may fluidly couple the compressible fluid container 1326 to a fluid channel 1311 defined in the carrier first portion 1302, as previously described herein.

A portion of the internal volume surrounding the compressible fluid container 1326 is filled with a compressed gas (e.g., compressed air or nitrogen). The compressed gas exerts a constant pressure on the compressible fluid container 1326 causing the compressible fluid container 1326 to deliver the pressurized fluid through the needle 1321 and the fluid channel 1311 into the fluid reservoir 501. As the micro-valve 530 opens and fluid is ejected from the orifice 560, the compressible fluid container 1326 delivers more fluid to the fluid reservoir 501 due to the continuous gas pressure acting thereon. In this manner, a separate fluid connector and pressurized supply of fluid can be excluded from the non-contact deposition system including the jetting assembly 1300.

In some embodiments, the jetting assembly 1300 may be replaced with a fresh jetting assembly once the fluid contained with the carrier second portion 1320 is used up. In other embodiments, the carrier 1310 or a portion thereof may be removably coupled to the micro-valve which can be replaced with a fresh carrier 1310 or portion thereof once the fluid contained therewithin is used up. For example, the carrier second portion 1320 may be removably coupled to the carrier first portion 1302, for example, via a snap-fit mechanism (e.g., clips, ledges, detents, indents, etc.), belts, screws, pins, etc. Once all the fluid contained within the compressible fluid container 1326 has been delivered to the fluid reservoir 510, a user may replace the carrier second portion 1320 with a new one that is filled with fluid.

FIG. 17 is a schematic illustration of a jetting assembly 1400, according to another embodiment. The jetting assembly 1400 includes the micro-valve 530 and a carrier 1410 coupled to the micro-valve 530. The carrier 1410 comprises a carrier first portion 1402 that is coupled to the micro-valve 530. The carrier first portion 1402 may be substantially similar to the carrier 502 and therefore, not described in further detail herein. The carrier 1410 also comprises a carrier second portion 1420 disposed on and coupled to the carrier first portion 1402. The carrier second portion 1420 includes a carrier second portion housing 1422 defining an internal volume 1424 within which the compressible fluid container 1426 is disposed. A needle 1421 may fluidly couple the compressible fluid container 1426 to a fluid channel 1411 defined in the carrier first portion 1402, as previously described herein.

Different from the carrier 1310, the carrier 1410 includes a biasing member 1428 disposed in the internal volume 1424 which may be coupled to a pressure plate 1429 in contact with the compressible fluid container 1426. The biasing member 1428 urges the pressure plate 1429 towards the compressible fluid container 1426 so as to exert a pressure on the compressible fluid container 1426. The pressure causes the fluid to be communicated through the fluid channel 1411 into the fluid reservoir 501.

FIG. 18 is a schematic illustration of a jetting assembly 1500, according to yet another embodiment. The jetting assembly 1500 includes the micro-valve 530 and a carrier 1510 coupled to the micro-valve 530. The carrier 1510 includes a carrier first portion 1502 coupled to the micro-valve 530, and a carrier second portion 1520 coupled to the carrier first portion 1502. The carrier first portion 1502 is substantially similar to the carrier first portion 1302. Different from the carrier second portion 1320, the carrier second portion 1520 includes a diaphragm 1526 dividing an internal volume of the carrier second portion 1520 into a first volume 1524 and a second volume 1525. The first volume 1524 is filled with compressed gas (e.g., compressed air or nitrogen) and the second volume 1525 is filled with a fluid. The compressed gas exerts a pressure on the diaphragm 1526 and thereby on the fluid which causes the fluid to be communicated into the fluid reservoir 501.

Figure 19:
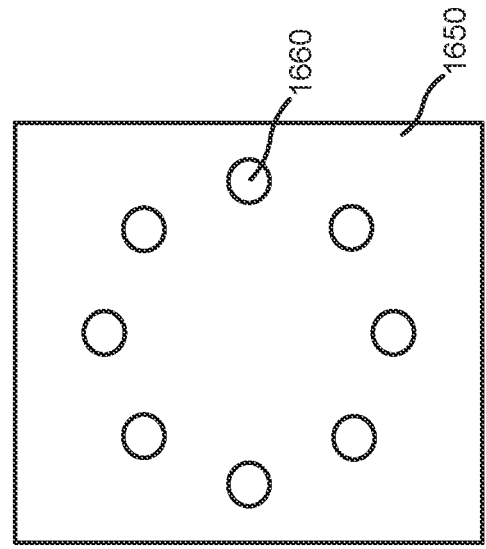
FIGS. 19-23 are schematic illustrations of orifice plates defining different shaped arrays of orifices therethrough, according to various embodiments.
Figure 20:
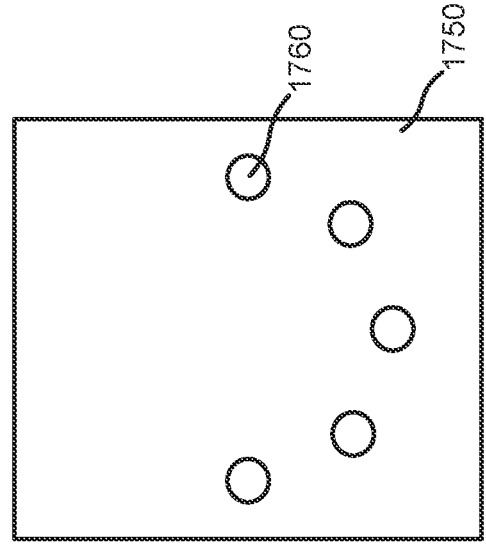
Figure 21:
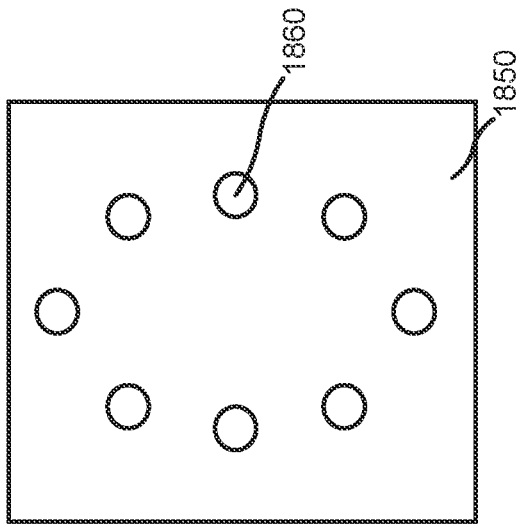
Figure 22:
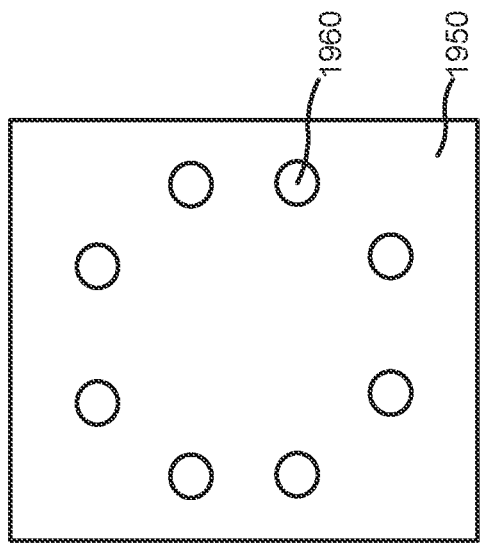
Figure 23:
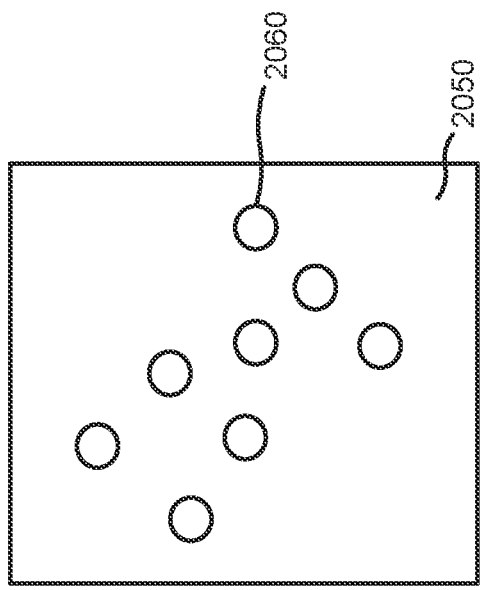

While various embodiments of jetting assemblies shown herein include a single orifice, in other embodiments, an array of orifices may be defined in the orifice plate of the jetting assembly in any suitable pattern. For example, FIG. 19 shows an embodiment of an orifice plate 1650 that includes an array of orifices defined in circular pattern. FIG. 20 shows another embodiment of an orifice plate 1750 that includes an array of orifices 1760 defined in a semi-circular pattern. FIG. 21 shows still another embodiment of an orifice plate 1850 that includes an array of orifices 1860 defined in an elliptical pattern. FIG. 22 shows yet another embodiment of an orifice plate 1950 that includes an array of orifices 1960 defined in an octagonal pattern. FIG. 23 shows still another embodiment of an orifice plate 2050 that includes an array of orifices 2060 defined in an asymmetrical pattern.

In some embodiments, a micro-valve including the orifice plates 1650, 1750, 1850, 1950, 2050 may include a single actuating beam for depositing the fluid through each of the plurality of orifices 1660, 1760, 1860, 1960, 2060. For example, a sealing member (e.g., the sealing member 588) of the actuating beam (e.g., the actuating beam 540) may be sufficiently large to overlap and seal each of the plurality of orifices 1660, 1760, 1860, 1960, 2060 in the closed position of the micro-valve such that when the actuating beam moves into the open position, the fluid is ejected through each of the plurality of orifices 1660, 1760, 1860, 1960, 2060. In other embodiments, a dedicated actuating beam may associated with a corresponding orifice of the plurality of orifices 1660, 1760, 1860, 1960, 2060 such that fluid may be deposited selectively through one or more of the orifices 1660, 1760, 1860, 1960, 2060 based on a particular application. It should be appreciated that while FIGS. 19-23 specific patterns of the orifices, in other embodiments, the orifices may be defined in orifice plates in any suitable pattern. All such arrangements should be considered to be within the scope of this disclosure.

Figure 24:
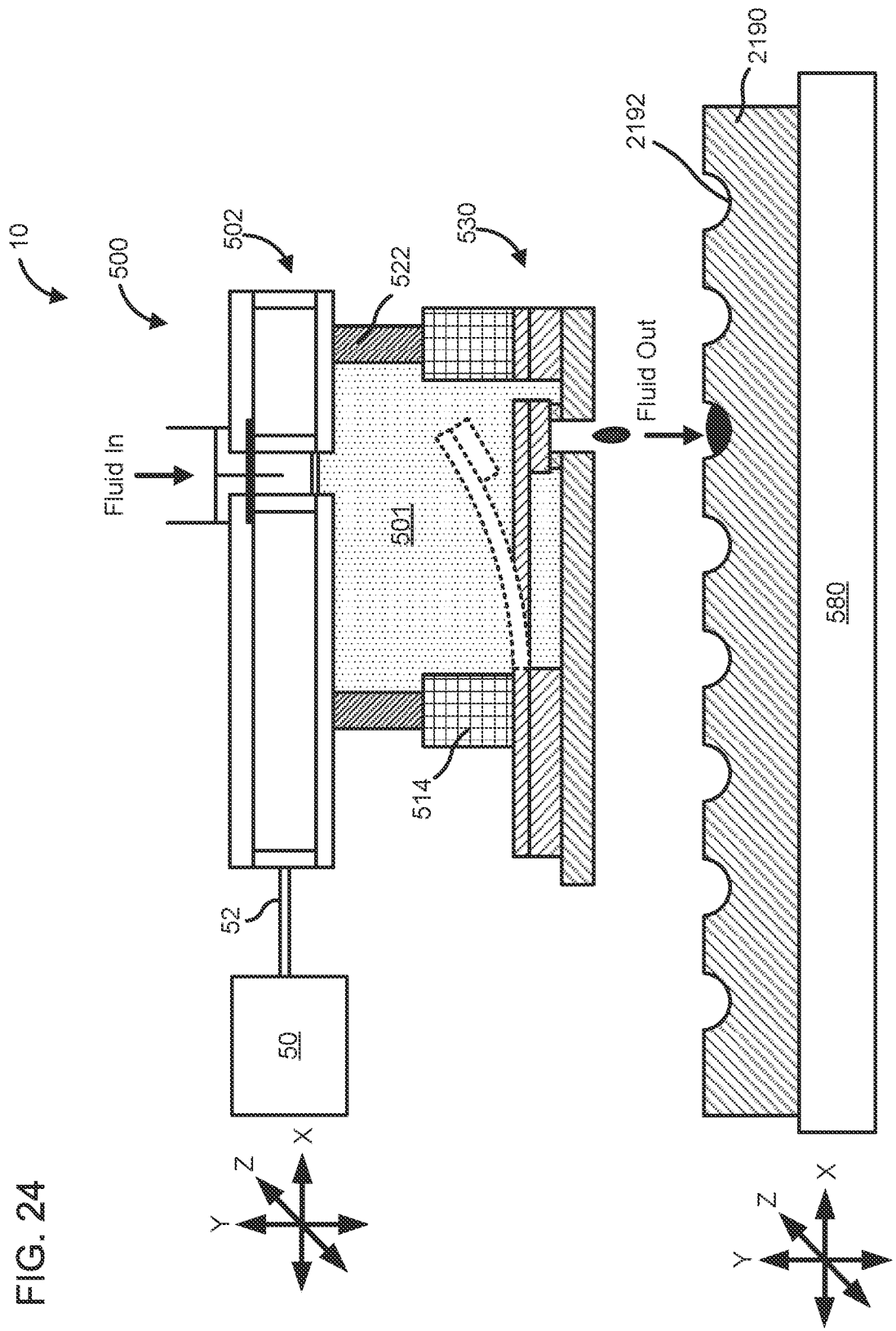
FIG. 24 is a schematic illustration of the non-contact deposition system of FIG. 8 for depositing fluids on a microwell plate, according to an embodiment.

In some embodiments, any of the non-contact deposition systems described herein may be configured to deposit fluids on a microwell plate. For example, FIG. 24 is a schematic illustration of the non-contact deposition system 10 with a microwell plate 2190 disposed on the platform 580. The microwell plate 2190 defines a plurality of microwells 2192 (e.g., arranged in a rectangular array). In some embodiments, the microwell plate 2190 may include an array of microwells 2192 (e.g., 6, 12, 24, 48, 96, 384, 1,536, 3,456 or 9,600 microwells) arranged in any suitable configuration, for example, a 2:3 rectangular matrix. Each microwell 2192 may be configured to hold a volume of fluid, for example, in a range from 10 nLs to 10 mL.

In such embodiments, the fluid may include a solution of chemical, biochemical, and/or biological molecules and the non-contact deposition system 10 may be configured to deposit a volume of the solution in each of the plurality of microwells. For example, the fluid may include solutions used to perform Enzyme Linked Immunosorbent Assays (ELISA), polymerase chain reactions (PCRs), cell culture, filtration, separation, optical detection, reaction mixing, detection of microbial activity, etc. In some embodiments, the non-contact deposition system 10 may include a plurality of jetting assemblies 500, each configured to deposit a separate solution in a corresponding microwell 2192. In other embodiments, the non-contact deposition system 10 may include the jetting assembly 1200 instead of the jetting assembly 500 or any other jetting assembly that can deposit a plurality of fluids on the micro-well plate 1290.

In still further embodiments, the deposition systems which include jetting assemblies and micro-valves are configured to dispense a fluid that is a gas. Such fluids are collectively referred to as gaseous fluids. The type of gas is not limited and can be one or more of air, oxygen, nitrogen, carbon dioxide, hydrogen, or a noble gas. Examples of noble gasses include one or more of helium, neon, argon, krypton, xenon, and radon. In some configurations, the gaseous fluid can include one or more liquid particles, for example water that is in an atomized form. However, in other configurations, the gaseous fluid does not include any added liquid particles. It should be noted that when the gaseous fluid does not include any added liquid particles, there can still be some measurable amount of liquid particles that are incidental to the system, such as from the condensation of moisture in atmospheric air that is compressed.

When the deposition systems are configured to dispense gaseous fluids, the pressure of the gaseous fluid inside a reservoir of the jetting assembly or the micro-valves is higher than the pressure of the atmosphere that surrounds the deposition system, jetting assembly or micro-valves. This ensures that the gaseous fluid is ejected from the an orifice and into the atmosphere. In some embodiments, the pressure can be changed during operation to provide for different uses or different operation effects for the same deposition system.

When the deposition systems are configured to dispense gaseous fluids, the deposition systems can be incorporated into various devices. For example, such deposition systems can be incorporated into one or more of sorting equipment, dehydrators, air knives, air jet cleaners, liquid aeration, spray coating, optics cleaners, surface cleaners, and haptic interface devices. Examples of haptic interface devices that include the deposition systems described herein include one or more of headsets, hand coverings, gloves configured to fit hands, foot coverings, boots configured to fit feet, pants, shirts, coverings for any section of skin, head coverings, and face coverings. Such haptic interface devices direct the gaseous fluid towards a wearer or user, thereby enabling the wearer or user to perceive haptic sensations.

As used herein, the terms "about" and "approximately" generally mean plus or minus 10% of the stated value. For example, about 0.5 would include 0.45 and 0.55, about 10 would include 9 to 11, about 1000 would include 900 to 1100.

The terms "coupled," "connected," and the like, as used herein, mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," etc.) are merely used to describe the orientation of various elements in the figures. It should be noted that the orientation of various elements may differ according to other exemplary embodiments, and that such variations are intended to be encompassed by the present disclosure.

The construction and arrangement of the elements as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements, the position of elements may be reversed or otherwise varied, and the nature or number of discrete elements or positions may be altered or varied.

Additionally, the word "exemplary" is used to mean serving as an example, instance, or illustration. Any embodiment or design described herein as "exemplary" or as an "example" is not necessarily to be construed as preferred or advantageous over other embodiments or designs (and such term is not intended to connote that such embodiments are necessarily extraordinary or superlative examples). Rather, use of the word "exemplary" is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

It is important to note that the construction and arrangement of the various embodiments presented herein are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Additionally, it should be understood that features from one embodiment disclosed herein may be combined with features of other embodiments disclosed herein as one of ordinary skill in the art would understand. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A non-contact deposition system, comprising:
   a jetting assembly comprising:
      at least one micro-valve, each micro-valve comprising:
         an orifice plate including a first surface and a second surface, the orifice plate comprising an orifice extending from the first surface to the second surface,
         a spacing member disposed on the first surface, the spacing member offset from the orifice,
         a valve seat surrounding the orifice, the valve seat defining an opening in fluid communication with the orifice,
         an actuating beam disposed on the spacing member, the actuating beam extending from the spacing member toward the orifice, the actuating beam comprising a layer of piezoelectric material, the actuating beam movable between a closed position and an open position by applying an electrical signal to the layer of piezoelectric material, and a sealing member disposed on an end portion of the actuating beam; and a fluid manifold coupled to the micro-valve and defining a fluid reservoir containing a pressurized fluid around the actuating beam, wherein when the layer of piezoelectric material does not have an electrical signal applied thereto, the actuating beam is in the closed position, a sealing member surface of the sealing member contacts the orifice plate to seal the orifice and close the micro-valve, wherein in the open position fluid is ejected from the orifice towards a substrate and deposited thereon, and wherein a throw distance of the jetting assembly is configurable based on a modulation of an actuation frequency of the actuating beam.

2. The non-contact deposition system of claim 1, further comprising:

a platform spaced apart from the jetting assembly and configured to receive a substrate on which the fluid is to be deposited; and a motion mechanism coupled to at least one of the jetting assembly or the platform and configured to provide three dimensional motion to the jetting assembly or the platform so as to deposit the fluid at a predetermined location of on the substrate.

3. The non-contact deposition system of claim 2, wherein the substrate comprises a slide, and wherein the non-contact deposition system is configured to deposit an array of droplets of the fluid on the slide.

4. The non-contact deposition system of claim 1, wherein the fluid is a gaseous fluid.

5. The non-contact deposition system of claim 1, further comprising an article configured to cover a portion of a wearer, wherein the jetting assembly is interfaced to the article and wherein the fluid, when ejected, is configured to cause a haptic stimulus to the wearer.

6. A non-contact deposition system, comprising:

a jetting assembly comprising:

at least one micro-valve comprising:

an orifice plate including a first surface and a second surface, the orifice plate comprising an orifice extending from the first surface to the second surface, an actuating beam disposed in a spaced relationship to the orifice plate, the actuating beam including a base portion and a cantilevered portion, the cantilevered portion extending from the base portion towards the orifice such that an overlapping portion thereof overlaps the orifice, the actuating beam being movable between a closed position and an open position, and a sealing structure comprising a sealing member disposed at the overlapping portion of the cantilevered portion; and a fluid manifold coupled to the micro-valve and defining a fluid reservoir containing a pressurized fluid around the actuating beam, wherein, when the actuating beam is in the closed position, the cantilevered portion is positioned such that the sealing structure member the orifice so as to close the micro-valve, and the in the open position, the fluid is dispensed from the orifice towards a substrate and deposited thereon, and wherein a throw distance of the jetting assembly is configurable based on a modulation of an actuation frequency of the actuating beam.

7. The non-contact deposition system of claim 6, further comprising:

a platform spaced apart from the jetting assembly and configured to receive the substrate; and a motion mechanism coupled to at least one of the jetting assembly or the platform and configured to provide three dimensional motion to the jetting assembly or the platform so as to deposit the fluid at a predetermined location of on the substrate.

8. The non-contact deposition system of claim 7, wherein the substrate comprises a slide, and wherein the non-contact deposition system is configured to deposit an array of droplets of the fluid on the slide.

9. The non-contact deposition system of claim 6, wherein the fluid is a gaseous fluid.

10. The non-contact deposition system of claim 6, further comprising an article configured to cover a portion of a wearer, wherein the jetting assembly is interfaced to the article and wherein the fluid, when ejected, is configured to cause a haptic stimulus on the wearer.

* * * * *